US010880039B2

(12) United States Patent
Licardie et al.

(10) Patent No.: US 10,880,039 B2
(45) Date of Patent: *Dec. 29, 2020

(54) MANAGING INTEGRITY OF FRAMED PAYLOADS USING REDUNDANT SIGNALS

(71) Applicant: Aviat U.S., Inc., Austin, TX (US)

(72) Inventors: Sergio Licardie, Cupertino, CA (US); Rishipal Arya, San Jose, CA (US); Robert Brown, Boulder Creek, CA (US)

(73) Assignee: Aviat U.S., Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/698,126

(22) Filed: Nov. 27, 2019

(65) Prior Publication Data
US 2020/0099470 A1 Mar. 26, 2020

Related U.S. Application Data

(63) Continuation of application No. 16/162,283, filed on Oct. 16, 2018, now Pat. No. 10,498,488, which is a (Continued)

(51) Int. Cl.
*H04L 1/00* (2006.01)
*H04B 7/08* (2006.01)
(Continued)

(52) U.S. Cl.
CPC .......... *H04L 1/0061* (2013.01); *H03M 13/37* (2013.01); *H03M 13/451* (2013.01);
(Continued)

(58) Field of Classification Search
CPC ...... G06F 11/1004; H04L 1/0061; H04L 1/02; H04B 7/04
See application file for complete search history.

(56) References Cited

U.S. PATENT DOCUMENTS 4,497,058 A   1/1985  Sako
5,361,266 A   11/1994 Kodama
(Continued)

FOREIGN PATENT DOCUMENTS

WO      9737459     10/1997

OTHER PUBLICATIONS

European Application No. 15861693.8, Search Report dated Mar. 4, 2020, 6 pages.
(Continued)

*Primary Examiner* — Guy J Lamarre
(74) *Attorney, Agent, or Firm* — Sheppard, Mullin, Richter & Hampton LLP

(57) ABSTRACT

A frame error correction circuit may identify and correct errors in data frames provided to a receiver as part of a diversity communications scheme. The frame error correction circuit may further align the data frames so that the data frames can be compared. The frame error correction circuit may perform a bit-wise comparison of the data frames and identify inconsistent bit positions where bits in the data frames differ from one another. Once inconsistent bit positions have been identified, the frame error correction circuit may access a permutation table of permutations of bits at the inconsistent bit positions. In some implementations, the frame error correction circuit uses the permutation table to reassemble permutations of the data frames. In various implementations, the frame error correction circuit performs a CRC of each permutation of the data frames, and provides a valid permutation to a network.

18 Claims, 19 Drawing Sheets

Related U.S. Application Data continuation of application No. 15/622,039, filed on Jun. 13, 2017, now Pat. No. 10,103,842, which is a continuation of application No. 14/948,203, filed on Nov. 20, 2015, now Pat. No. 9,680,606.

(60) Provisional application No. 62/082,550, filed on Nov. 20, 2014.

(51) Int. Cl.
| | | |
|---|---|---|
| *H03M 13/37* | (2006.01) | |
| *H03M 13/47* | (2006.01) | |
| *H04L 1/02* | (2006.01) | |
| *H04B 7/10* | (2017.01) | |
| *H03M 13/45* | (2006.01) | |
| *H03M 13/00* | (2006.01) | |
| *H03M 13/09* | (2006.01) | |

(52) U.S. Cl.
CPC ....... *H03M 13/47* (2013.01); *H03M 13/6306* (2013.01); *H04B 7/0882* (2013.01); *H03M 13/09* (2013.01); *H04B 7/10* (2013.01); *H04L 1/0045* (2013.01); *H04L 1/02* (2013.01)

(56) References Cited

U.S. PATENT DOCUMENTS

| | | | |
|---|---|---|---|
| 6,212,662 | B1 | 4/2001 | Hekstra |
| 9,680,606 | B2 | 6/2017 | Licardie |
| 10,103,842 | B2 | 10/2018 | Licardie et al. |
| 10,498,488 | B2 * | 12/2019 | Licardie ................ H03M 13/37 |
| 2005/0226190 | A1 | 10/2005 | Lam |
| 2008/0288845 | A1 | 11/2008 | Tsfati |
| 2013/0346826 | A1 | 12/2013 | Zopf |
| 2014/0089560 | A1 | 3/2014 | Sunkavalli |

OTHER PUBLICATIONS

European Application No. 15861693.8 Search Report dated Jun. 22, 2018.

International Application No. PCT/US2015/062014, International Search Report and Written Opinion dated Feb. 16, 2016.

\* cited by examiner

500C

| BER | Frame Length | | | | | | | |
|---|---|---|---|---|---|---|---|---|
| | 64 | 128 | 256 | 512 | 1024 | 1518 | 4000 | 10000 |
| 1.00E-08 | 5.12E-06 | 1.02E-05 | 2.05E-05 | 4.10E-05 | 8.19E-05 | 1.21E-04 | 3.20E-04 | 8.00E-04 |
| 1.00E-07 | 5.12E-05 | 1.02E-04 | 2.05E-04 | 4.10E-04 | 8.19E-04 | 1.21E-03 | 3.20E-03 | 8.00E-03 |
| 1.00E-06 | 5.12E-04 | 1.02E-03 | 2.05E-03 | 4.10E-03 | 8.19E-03 | 1.21E-02 | 3.20E-02 | 8.00E-02 |
| 1.00E-05 | 5.12E-03 | 1.02E-02 | 2.05E-02 | 4.10E-02 | 8.19E-02 | 1.21E-01 | 3.20E-01 | 8.00E-01 |
| 1.00E-04 | 5.12E-02 | 1.02E-01 | 2.05E-01 | 4.10E-01 | 8.19E-01 | 1.21E+00 | 3.20E+00 | 8.00E+00 |
| 1.00E-03 | 5.12E-01 | 1.02E+00 | 2.05E+00 | 4.10E+00 | 8.19E+00 | 1.21E+00 | 3.20E+00 | 8.00E+00 |

| BER | Frame Length | | | | | | |
|---|---|---|---|---|---|---|---|
| | 64 | 128 | 256 | 512 | 1024 | 1518 | 4000 | 10000 |
| 1.00E-08 | 5.12E-06 | 1.02E-05 | 2.05E-05 | 4.10E-05 | 8.19E-05 | 1.21E-04 | 3.20E-04 | 8.00E-04 |
| 1.00E-07 | 5.12E-05 | 1.02E-04 | 2.05E-04 | 4.10E-04 | 8.19E-04 | 1.21E-03 | 3.20E-03 | 8.00E-03 |
| 1.00E-06 | 5.12E-04 | 1.02E-03 | 2.05E-03 | 4.10E-03 | 8.19E-03 | 1.21E-02 | 3.20E-02 | 8.00E-02 |
| 1.00E-05 | 5.12E-03 | 1.02E-02 | 2.05E-02 | 4.10E-02 | 8.19E-02 | 1.21E-01 | 3.20E-01 | 8.00E-01 |
| 1.00E-04 | 5.12E-02 | 1.02E-01 | 2.05E-01 | 4.10E-01 | 8.19E-01 | 1.21E+00 | 3.20E+00 | 8.00E+00 |
| 1.00E-03 | 5.12E-01 | 1.02E+00 | 2.05E+00 | 4.10E+00 | 8.19E+00 | 1.21E+01 | 3.20E+01 | 8.00E+01 |

| S | R | N = SR = Δ | Brute Force $T=S^N$ | Max R errors per stream $T=\sum_{k=0}^{R} {}_NC_k$ | Ratio |
|---|---|---|---|---|---|
| 2 | 1 | 2 | 4 | 3 | 1.33 |
| 2 | 2 | 4 | 16 | 11 | 1.45 |
| 2 | 3 | 6 | 64 | 42 | 1.52 |
| 2 | 4 | 8 | 256 | 163 | 1.57 |
| 2 | 5 | 10 | 1024 | 638 | 1.61 |
| 2 | 6 | 12 | 4096 | 2510 | 1.63 |
| 2 | 7 | 14 | 16384 | 9908 | 1.65 |
| 2 | 8 | 16 | 65536 | 39203 | 1.67 |
| 2 | 9 | 18 | 262144 | 155382 | 1.69 |
| 2 | 10 | 20 | 1048576 | 616666 | 1.70 |
| 2 | 11 | 22 | 4194304 | 2449868 | 1.71 |
| 2 | 12 | 24 | 16777216 | 9740686 | 1.72 |
| 2 | 13 | 26 | 67108864 | 38754732 | 1.73 |
| 2 | 14 | 28 | 268435456 | 154276028 | 1.74 |
| 2 | 15 | 30 | 1073741824 | 614429672 | 1.75 |
| 2 | 16 | 32 | 4294967296 | 2448023843 | 1.75 |
| 2 | 17 | 34 | 17179869184 | 9756737702 | 1.76 |
| 2 | 18 | 36 | 68719476736 | 38897306018 | 1.77 |

FIGURE 8

MANAGING INTEGRITY OF FRAMED PAYLOADS USING REDUNDANT SIGNALS

CROSS REFERENCE TO RELATED APPLICATIONS

The present application is a continuation of U.S. patent application Ser. No. 16/162,283, filed Oct. 16, 2018 and entitled "Managing Integrity of Framed Payloads Using Redundant Signals," now U.S. Pat. No. 10,498,488, which is a continuation of U.S. patent application Ser. No. 15/622,039, filed Jun. 13, 2017 and entitled "Managing Integrity of Framed Payloads Using Redundant Signals," now U.S. Pat. No. 10,103,842, which is a continuation of U.S. patent application Ser. No. 14/948,203, filed Nov. 20, 2015 and entitled "Managing Integrity of Framed Payloads Using Redundant Signals," now U.S. Pat. No. 9,680,606, which claims the benefit of priority under 35 U.S.C. § 119(a) to U.S. Provisional Patent Application Ser. No. 62/082,550, filed Nov. 20, 2014 and entitled "Ethernet Protection by Ethernet Frame Selection and Correction in Diversity Links," which are hereby incorporated by reference herein.

TECHNICAL FIELD

The technical field relates to wireless communication systems that implement signal diversity, and more particularly to systems and methods for managing the integrity of data in wireless communication systems that implement signal diversity.

BACKGROUND

In wireless communications systems that employ diversity communication schemes, one or more transmitters provide redundant versions of data to one or more receivers. The transmitters typically use a variety of techniques, such as time diversity techniques, frequency diversity techniques, spatial diversity techniques, polarization diversity techniques, and/or other techniques to transmit framed packets. The framed packets may include preamble(s), header(s), payload(s), error checking portion(s) (e.g., frame check sequences), end of frame delimiter(s), and other portions.

Diversity communication schemes serve many purposes, including to increase the chances that frames being received without error in a radio link. Typically, when errors are detected in a primary frame, the corresponding redundant frames are checked for errors.

SUMMARY

In various implementations, a frame error correction circuit identifies and corrects errors in data frames provided to a receiver as part of a diversity communications scheme. The frame error correction circuit may identify data frames of two or more redundant data streams that have failed error check sequences (e.g., Cyclic Redundancy Check (CRC) sequences). The frame error correction circuit may further align the data frames so that the data frames can be compared. The frame error correction circuit may perform a bit-wise comparison of the data frames and identify inconsistent bit positions where bits in the data frames differ from one another. Once inconsistent bit positions have been identified, the frame error correction circuit may access a permutation table of permutations of bits at the inconsistent bit positions. In some implementations, the frame error correction circuit uses the permutation table to reassemble permutations of the data frames. In various implementations, the frame error correction circuit performs a CRC of each permutation of the data frames, and provides a valid permutation to a network. The frame error correction circuit may be incorporated into an Indoor Unit (IDU) of a split-mount radio, and may be incorporated into signal processing circuitry of the IDU.

A system may include a data interface circuit configured to receive a plurality of data frames corresponding to redundant data, the plurality of data frames having an error checking portion, the error checking portion having a frame error checking code. A bit position comparison circuit coupled to the data interface circuit may be configured to compare bit positions of each of the plurality of data frames, and to identify inconsistent bit positions in the plurality of data frames. A frame permutation assembly circuit coupled to the bit position comparison circuit may be configured to assemble permutations of data frames, each of the permutations of data frames including a unique set of permutations of bits at each of the inconsistent bit positions. A frame error checking circuit coupled to the frame permutation assembly circuit may be configured to calculate a calculated error checking code of each of the permutations of data frames, and to compare the calculated error checking code with at least one of the frame error checking codes in the error checking portions of the plurality of data frames.

In some implementations, the bit position comparison circuit is configured to compare byte positions each of the plurality of data frames, and to identify inconsistent byte positions in the plurality of data frames; and the permutations of data frames include a unique set of permutations of bytes at each of the inconsistent byte positions.

In some implementations, the system is incorporated into an indoor unit (IDU) of a split-mount radio system.

In various implementations, the bit position comparison circuit is configured to perform a bitwise Exclusive Or (XOR) operation on each of the plurality of data frames to identify the inconsistent bit positions in the plurality of data frames. The bit position comparison circuit may be configured to perform a summation and voting operation on each of the plurality of data frames to identify the inconsistent bit positions in the plurality of data frames. The plurality of data streams may comprise more than two data streams.

In an implementation, the system supports a radio link, and the permutations of data frames are limited by a specified error rate of the radio link. The plurality of data frames may comprise Ethernet data frames.

In various implementations, the data interface circuit is configured to provide a passed data frame from the permutations of data frames, the calculated error checking code of the passed data frame being consistent with the frame error checking code of the error checking portions of the passed data frame.

A method may comprise: receiving a plurality of data frames corresponding to redundant data, the plurality of data frames having an error checking portion, the error checking portion having a frame error checking code; comparing bit positions of each of the plurality of data frames, and to identify inconsistent bit positions in the plurality of data frames; assembling permutations of data frames, each of the permutations of data frames including a unique set of permutations of bits at each of the inconsistent bit positions; and calculating a calculated error checking code of each of the permutations of data frames, and to compare the calculated error checking code with at least one of the frame error checking codes in the error checking portions of the plurality of data frames.

In some implementations, the methods may comprise: comparing bit positions of each of the plurality of data frames comprises comparing byte positions each of the plurality of data frames, and identifying inconsistent byte positions in the plurality of data frames; and the permutations of data frames include a unique set of permutations of bytes at each of the inconsistent byte positions.

In some implementations, the methods may be executed by a controller module of an indoor unit (IDU) of a split-mount radio system.

Comparing bit positions of each of the plurality of data frames may comprise performing a bitwise Exclusive Or (XOR) operation on each of the plurality of data frames to identify the inconsistent bit positions in the plurality of data frames. Comparing bit positions of each of the plurality of data frames may comprise perform a summation and voting operation on each of the plurality of data frames to identify the inconsistent bit positions in the plurality of data frames. The plurality of data streams comprises more than two data streams.

In an implementation, the permutations of data frames are limited by a specified error rate of a radio link supporting communication of the plurality of data frames. The plurality of data frames may comprise Ethernet data frames.

In some implementations, the methods may comprise providing a passed data frame from the permutations of data frames, the calculated error checking code of the passed data frame being consistent with the frame error checking code of the error checking portions of the passed data frame.

A system may comprise: means for receiving a plurality of data frames corresponding to redundant data, the plurality of data frames having an error checking portion, the error checking portion having a frame error checking code; means for comparing bit positions of each of the plurality of data frames, and to identify inconsistent bit positions in the plurality of data frames; means for identifying assemble permutations of data frames, each of the permutations of data frames permutations of bits at each of the inconsistent bit positions; and means for calculating a calculated error checking code of each of the permutations of data frames, and to compare the calculated error checking code with the frame error checking code in the error checking portion of the plurality of data frames.

Other features and implementations are apparent from the accompanying drawings and from the following detailed description.

BRIEF DESCRIPTION OF THE DRAWINGS

FIG. 5C shows an example of a table that illustrates the expected number of errors for a plurality of radio link Bit Error Rates and frame lengths, according to some implementations.

FIG. 7C shows an example of a table that illustrates the expected number of errors for a plurality of radio link Bit Error Rates and frame lengths, according to some implementations.

FIG. 8 shows an example of a table that illustrates the effects of optimizing identification of errors in redundant frames, according to some implementations.

DETAILED DESCRIPTION

Example Wireless Communication System 100.

Figure 1:
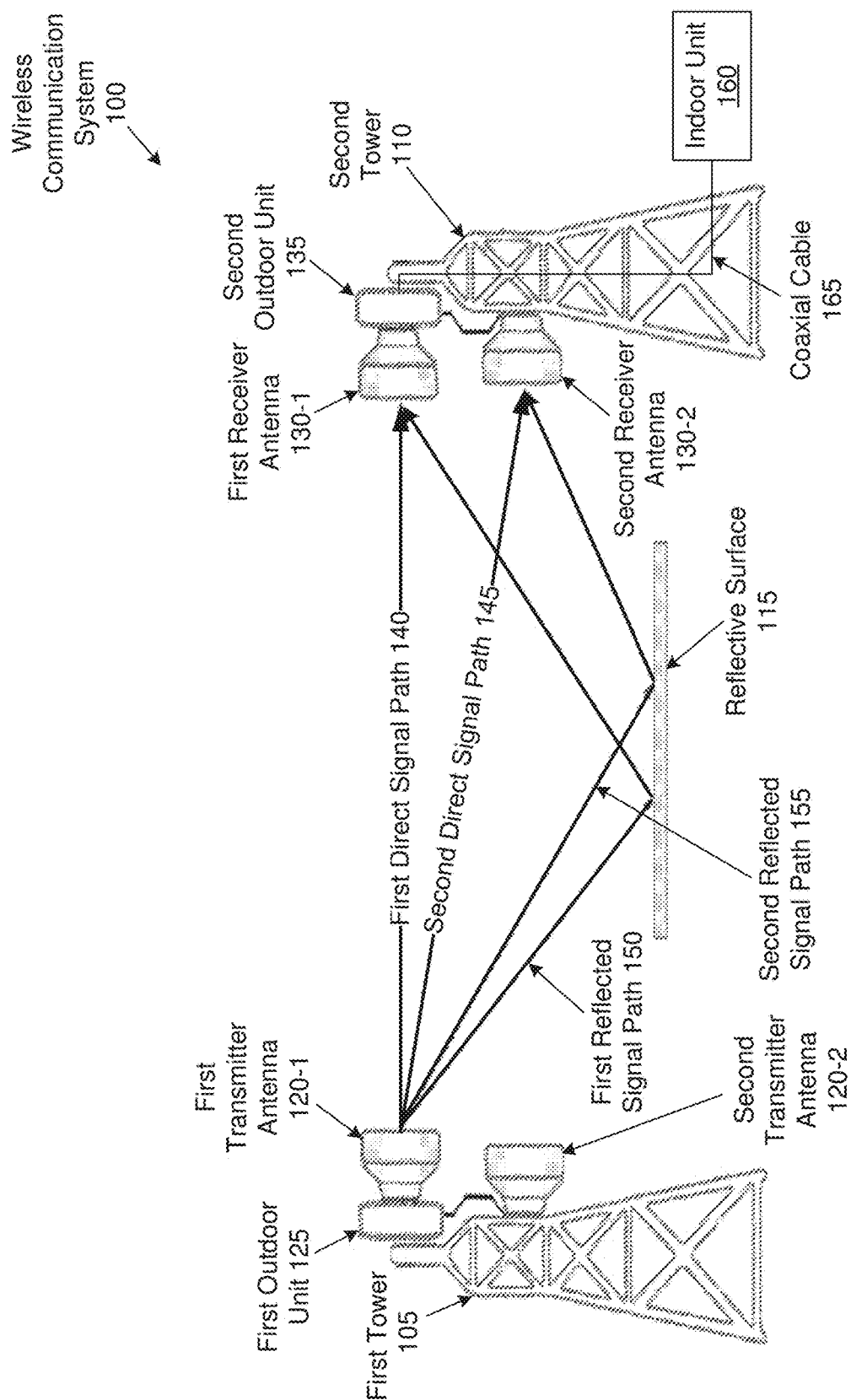
FIG. 1 shows an example of a wireless communication system, according to some implementations.

FIG. 1 shows an example of a wireless communication system 100, according to some implementations. In various implementations, the wireless communication system 100 may support microwave communications. The wireless communication system 100 includes a first tower 105, a second tower 110, and possibly a reflective surface 115. The first tower 105 may include a first transmitter antenna 120-1 and a second transmitter antenna 120-2 (referred to collectively as "transmitter antennas 120"), and a first outdoor unit ("ODU") 125. The second tower 110 may include a first receiver antenna 130-1 and a second receiver antenna 130-2 (referred to collectively as "receiver antennas 130"), a second ODU 135, and an indoor unit ("IDU") 160. The second ODU 135 may be coupled to the IDU 160 over a coaxial cable 165. In some implementations, the second ODU 135 and the IDU 160 are part of a split-mount radio system.

The reflective surface 115 may comprise a surface that resides between the first tower 105 and the second tower 110. In some implementations, the reflective surface 115 causes reflection of signals between one of the transmitter antennas 120 and the receiver antennas 130.

The receiver antennas 130 may receive redundant copies of data from the transmitter antennas 120. The data may be redundant due to a diversity scheme employed by the wireless communication system 100, due to reflections or obstacles that cause one of the receiver antennas 130 to receive multiple copies of a signal, or due to other factors. As an example, the first receiver antenna 130-1 and the second receiver antenna 130-2 may receive from one of the transmitter antennas 120 signals that are diverse in time, frequency, space, or polarization. As another example, a first direct signal path 140 and a first reflected signal path 150 may provide from the first transmitter antenna 120-1 redundant copies of a signal to the first receiver antenna 130-1. A second direct signal path 145 and a second reflected signal path 155 may similarly provide from the first transmitter antenna 120-1 redundant copies of a signal to the second receiver antenna 130-2.

When atmospheric conditions, the presence of obstacles in a signal path, environmental conditions, or other conditions adversely affect the signal paths between the transmitter antennas 120 and the receiver antennas 130, errors may occur. Some of these errors may be reflected as bit errors in the data frames processed by the IDU 160. Moreover, as these errors may depend on attributes of a specific signal path, these errors are unlikely to occur at the same location in the data frames of redundant data streams.

In various implementations, the IDU 160 includes error correction circuitry to identify errors in redundant signals received at the receiver antennas 130 by comparing bit positions in the frames of redundant signals against each another. The error correction circuitry in the IDU 160 may detect errors by calculating error checking codes (Cyclic Redundancy Checks (CRCs), etc.) of the frames, and by comparing the calculated value with the error checking codes contained in the error checking portions(s) of those frames. The error correction circuitry in the IDU 160 may further use redundant information in the different copies of the redundant signals to determine whether or not errors identified in the redundant signals are correctable. In various implementations, the IDU 160 uses the redundant information to correct those errors if those errors are correctable.

Example IDU 160.

Figure 2:
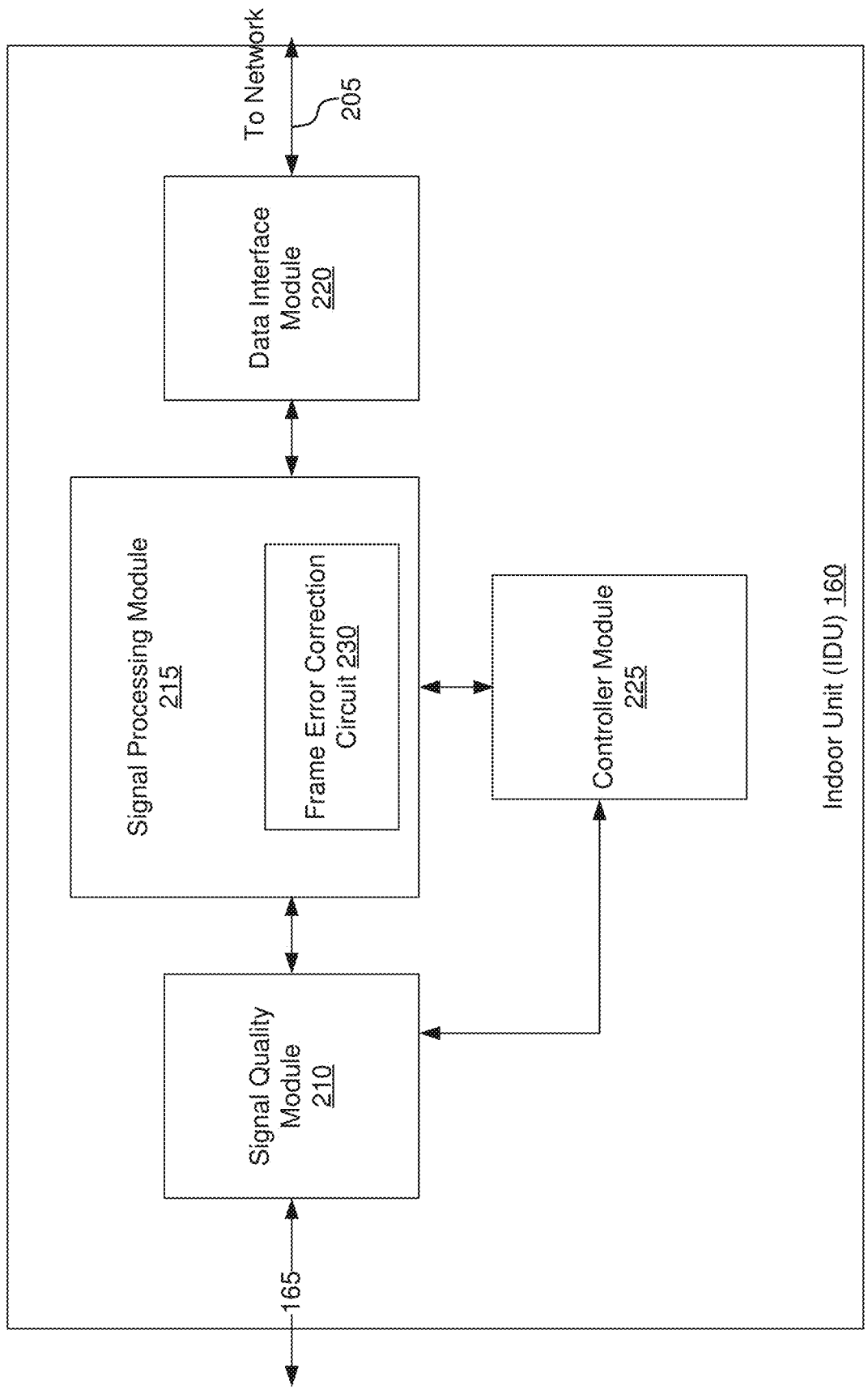
FIG. 2 shows an example of an indoor unit, according to some implementations.

FIG. 2 shows an example of an IDU 160, according to some implementations. The IDU 160 may be coupled to the second ODU 135 with the coaxial cable 165 and to a computer network (not shown) over a network interface cable 205. The IDU 160 may include a signal quality module 210, a signal processing module 215, a data interface module 220, and a controller module 225. One or more of the signal quality module 210, the signal processing module 215, and the data interface module 220, and the controller module 225 may be coupled to one another or to components not shown in FIG. 2.

The signal quality module 210 may be configured to manage signal quality of signals from second ODU 135. In various implementations, the signal quality module 210 is configured to combine and/or split data streams from the ODU 135. The signal quality module 210 may be incorporated into a modem. Those of ordinary skill in the art would appreciate that in some implementations, the signal quality module 210 may be replaced by a router module that routes signals to a passive splitter module and a passive combiner module. For example, in some implementations, the passive combiner module may comprise a passive concatenater, and a passive redundancy comparator.

The signal processing module 215 may be configured to process data for a number of purposes including, for example, conversion of data (e.g., converting between data and I-Q data), data compression, error correction, processing to further reduce of correlation between the polarization-diverse signals, filtering, and measuring data signals. In some implementations, the signal processing module 215 is configured to convert a processed data stream received from the signal quality module 210 to a form that may be received by the data interface module 220 and further processed by customer equipment (e.g., customer premises equipment). The signal processing module 215 may be incorporated into a modem.

Figure 3:
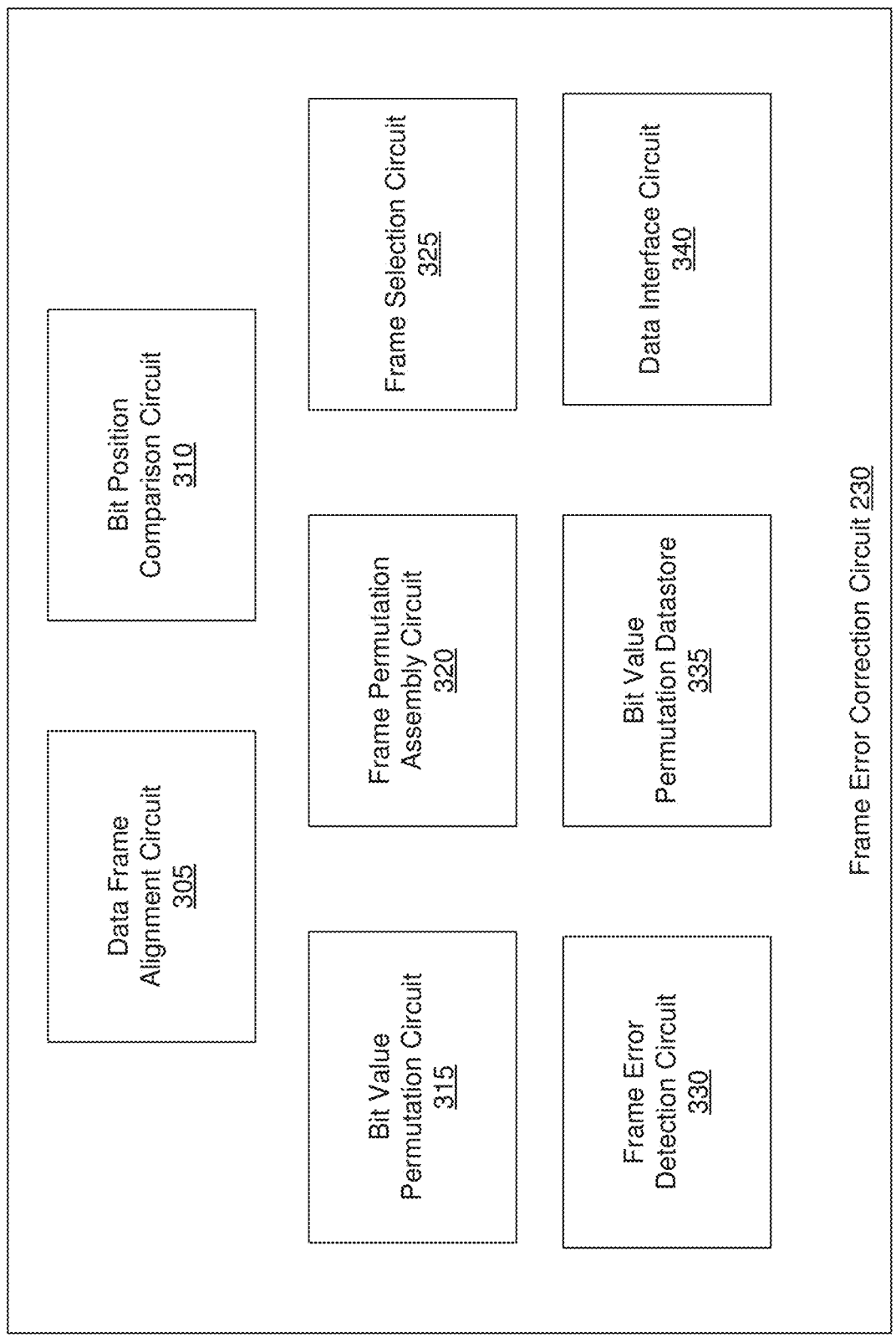
FIG. 3 shows an example of a frame error correction circuit, according to some implementations.

The signal processing module 215 may include a frame error correction circuit 230. The frame error correction circuit 230 may include circuitry configured to identify errors in data frames of redundant data from the second ODU 135. The redundant data may comprise redundant signals received by the first receiver antenna 130-1 and the second receiver antenna 130-2 as part of a diversity scheme, and/or copies of the same signal that has reached a receiver antenna 130 through different paths (e.g., a direct path and a reflected path). The frame error correction circuit 230 may calculate error checking codes of data frames, may compare bit positions of data frames of redundant data with one another, and/or may determine whether or not errors are identified in data frames are correctable. In some implementations, the frame error correction circuit 230 identifies permutations of bit values at bit positions where data frames of redundant data are not consistent with one another (e.g. inconsistent bit positions). The frame error correction circuit 230 may further use the permutation table to recover data frames for which errors were detected. FIG. 3 shows the frame error correction circuit 230 in greater detail.

The controller module 225 may be coupled to the signal quality module 210 and the signal processing module 215. In various implementations, the controller module 225 is configured to control operation of the signal quality module 210 (e.g., how to split or combine data streams). The controller module 225 may also be configured to control operation of the signal processing module 215.

The data interface module 220 may be coupled to a network with a network interface cable 205. In various implementations, the data interface module 220 provides data from the signal processing module 215 to the network over the network interface cable 205.

Example Frame Error Correction Circuit 230.

FIG. 3 shows an example of a frame error correction circuit 230, according to some implementations. The frame error correction circuit 230 includes a data frame alignment circuit 305, a bit position comparison circuit 310, a bit value permutation datastore 315, a frame permutation assembly circuit 320, a frame selection circuit 325, a frame error detection circuit 330, a bit value permutation datastore 335, and a data interface circuit 340. One or more of the data frame alignment circuit 305, the bit position comparison circuit 310, the bit value permutation datastore 315, the frame permutation assembly circuit 320, the frame selection circuit 325, the frame error detection circuit 330, the bit value permutation datastore 335, and the data interface circuit 340 may be coupled to one another or to modules not explicitly shown.

The data frame alignment circuit 305 may include a circuit configured to align bit positions of data frames of redundant data. The data frame alignment circuit 305 may be configured to receive data frames of redundant data from the signal quality module 210. In some implementations, the data frame alignment circuit 305 may be configured to buffer and/or align two or more data frames of redundant data so that bit positions of the data frames of redundant data can be compared with one another. The data frame alignment circuit 305 may provide the aligned data frames to one or more of the modules of the frame error correction circuit 230, such as the bit position comparison circuit 310.

The bit position comparison circuit 310 may include a circuit configured to compare bit positions of data frames of redundant data. More particularly, the bit position comparison circuit 310 may implement a bit-wise comparison operator for all bit positions of data frames of redundant data to identify where the data frames differ from one another. The bit-wise comparison operator may include an Exclusive Or (XOR) operation, and/or a summation and voting operation.

In some implementations, the bit position comparison circuit 310 may implement an Exclusive Or (XOR) operation on data frames of redundant data. More particularly, in these implementations, the bit position comparison circuit 310 may compute, bit-wise, the result of an Exclusive Or operation to identify bit positions in data frames of redundant data that differ from one another. As an example, the bit position comparison circuit 310 may implement the Exclusive Or operation in implementations where the frame error correction circuit 230 is provided two redundant data streams.

In various implementations, the bit position comparison circuit 310 may implement a summation and voting operation. More specifically, in these implementations, the bit position comparison circuit 310 may perform a bit-wise summation at each bit position in data frames of redundant data to produce a bit-wise summation result. The bit-wise summation result may represent confidence that the bits at that bit position are uncertain. The bit position comparison circuit 310 may further assign a voting score to the bit-wise summation result. The voting score may represent confidence that the bits at that bit position are uncertain. As an example, the bit position comparison circuit 310 may implement the summation and voting operation in implementations where the frame error correction circuit 230 is provided greater than two redundant data streams.

The bit position comparison circuit 310 may be configured to provide other modules of the frame error correction circuit 230, such as the bit value permutation datastore 315, the number of bit positions in data frames of redundant data that are inconsistent.

The bit value permutation datastore 315 may include a circuit configured to identify permutations of bit values at bit positions where redundant frames are not consistent with one another (e.g., inconsistent bit positions). In various implementations, the bit value permutation datastore 315 is implemented as a register or other storage medium that receives from the bit position comparison circuit 310 a number of inconsistent bit positions in data frames of redundant data. As an example, the bit value permutation datastore 315 may receive from the bit position comparison circuit 310 the fact that data frames of redundant data contain three inconsistent bit positions. The bit value permutation datastore 315 may also gather from the bit value permutation datastore 335 one or more tables that identify all sequence possibilities of bits for the number of those inconsistent bit positions. To continue the foregoing example, for three inconsistent bit positions, the bit value permutation datastore 315 may gather from the bit value permutation datastore 335 a three-bit binary permutation table.

The frame permutation assembly circuit 320 may include a circuit configured to assemble permutations of data frames by replacing inconsistent bit positions with the alternative permutations of bit values identified by the bit value permutation datastore 315. In some implementations, the frame permutation assembly circuit 320 performs a "brute force" approach that assembles all permutations of data frames in a permutation table. The "brute force" approach may be suited to testing every permutation of bit value found to be inconsistent in data frames of redundant data.

In some implementations, the frame permutation assembly circuit 320 performs a limited approach that reduce the number of permutations of data frames to be assembled from a permutation table. Under the limited approach, the parameter "N" may represent the total number of inconsistent bit positions in a set of data frame of redundant data. It is noted the parameter "N" may correspond to the number of inconsistent bit positions identified by the bit position comparison circuit 310 as well as the dimension of a binary permutation table provided by the bit value permutation datastore 315. Under the limited approach, the parameter "R" may represent the maximum number of bit errors that the implementation needs to correct to maintain an acceptable bit error rate. By applying the limit of R errors to each frame implementations utilizing the limited approach can reduce the number of trials to:

$$T = \sum_{k=0}^{R} \binom{N}{k}, \text{ where } \binom{N}{k} = \frac{N!}{k!(N-k)!}$$

It is noted that, compared to the brute force approach, the limited approach reduces the number of trials to be performed but it is also slightly weaker than the brute force approach because it will fail if more than R errors have occurred in the frame that is selected for mutation. The brute force approach will work even if all N errors occurred in the receive frame that is being mutated. In order to compare the number of trials required for each technique it is noted that N ("total number of errors to be corrected") needs to equal SR (the product of the number of received frames ("S") and the number of errors per frame ("R")). In other words, the total number of errors to correct must be equal to the number of received frames multiplied by the number of errors per frame. It is noted that in some implementations, the frame permutation assembly circuit 320 can compare the number of trials needed for the number of received frames ("S"). To compare the number of trials needed for S=2, it is noted S=2 is an interesting case because a summation and voting operation can be used to reduce S>2 cases to a manageable number of trials.

The frame selection circuit 325 may be configured to select frame permutations to provide to other modules. In some implementations, the frame selection circuit 325 receives permutations of data frames from the frame permutation assembly circuit 320. The frame selection circuit 325 may further provide permutations of data frames to the frame error detection circuit 330, and select specific permutations of data frames that pass the error checking code implemented by the frame error detection circuit 330. Like other components described herein, the frame selection circuit 325 is optional. Some implementations, e.g., parallel detection implementations, may not have this circuit.

The frame error detection circuit 330 may include a circuit configured to calculate error checking code (e.g., CRC) for data frames. The frame error detection circuit 330 may extract the error checking values in the error checking portion(s) of the data frames. The frame error detection circuit 330 compares the calculated error checking code for a data frame with the error checking code in the error checking portion(s) of the data frames, to determine whether or not the data frame is likely valid. As discussed herein, the frame error detection circuit 330 may be utilized for data frames of redundant data provided by the data frame alignment circuit 305 and/or for permutations of data frames of redundant data provided by the frame permutation assembly circuit 320.

The bit value permutation datastore 335 may include a circuit configured to store bit value permutations of bit values for various numbers of inconsistent bit positions. In some implementations, the bit value permutation datastore 335 maintains binary permutation tables corresponding to different numbers of bit positions.

The data interface circuit 340 may include a circuit configured to receive data from the signal quality module 210. The data interface circuit 340 may also be configured to send data to the data interface module 220.

Example Operation of Frame Error Correction Circuit 230.

The operation of the frame error correction circuit 230 will now be discussed in conjunction with FIGS. 3-8. More specifically, in various implementations, the frame error correction circuit 230 operates to identify errors in data frames of redundant data by comparing bit positions of one data frame against similar bit positions in other data frames. When data frames of redundant data are received by the data interface circuit 340, the data frames may be provided to the frame error correction circuit 230. The frame error detection circuit 330 may calculate a CRC associated with those data frames, and may compare the calculated CRC with the CRC value extracted from the error checking portion(s) of those data frames. If the calculated CRC of one of the data frames is equal to the CRC value extracted from the error checking portion(s) of the data frames, the frame error detection circuit 330 may provide the data frame to other modules within the signal processing module 215. It is noted that, because the calculated CRC of the data frame matches the CRC in the error checking portion(s) of the data frame, the data frame is not corrupted.

Figure 4:
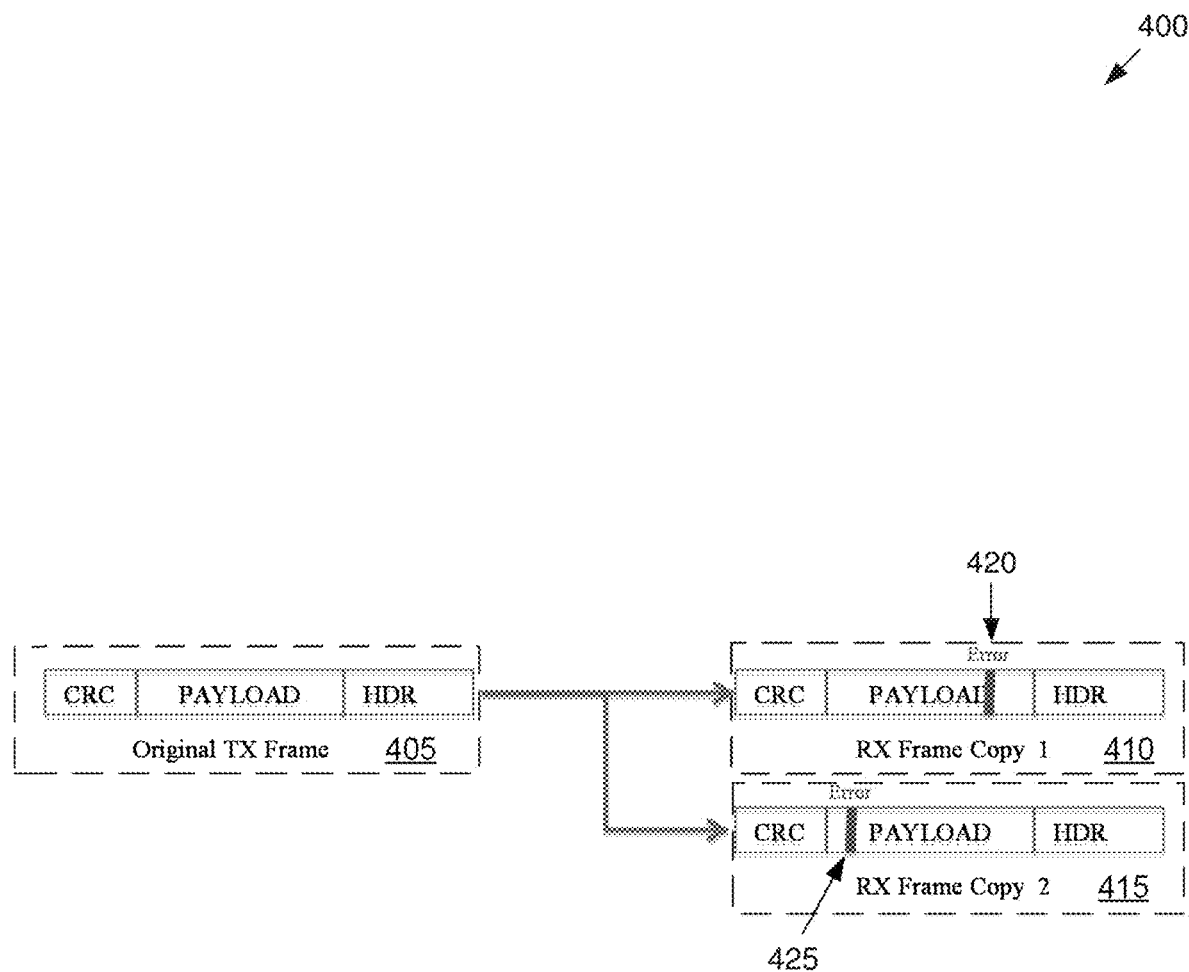
FIG. 4 shows an example of a plurality of data frames having payloads whose integrity has been compromised, according to some implementations.

If the calculated CRC of none of the data frames is equal to the CRC value extracted from the error checking portion(s) of the data frames, there may be errors in the payload of one or more of the data frames, as shown in FIG. 4. In various implementations, the data frame alignment circuit 305 may operate to align the data frames of redundant data for comparison. In some implementations, the data frame alignment circuit 305 buffers or performs other operations so that bit positions of the data frames are aligned for bit-wise comparison. The data frame alignment circuit 305 may provide the aligned data frames to the bit position comparison circuit 310. Examples of aligned frames are found in FIG. 5A and FIG. 7A.

Figure 5A:
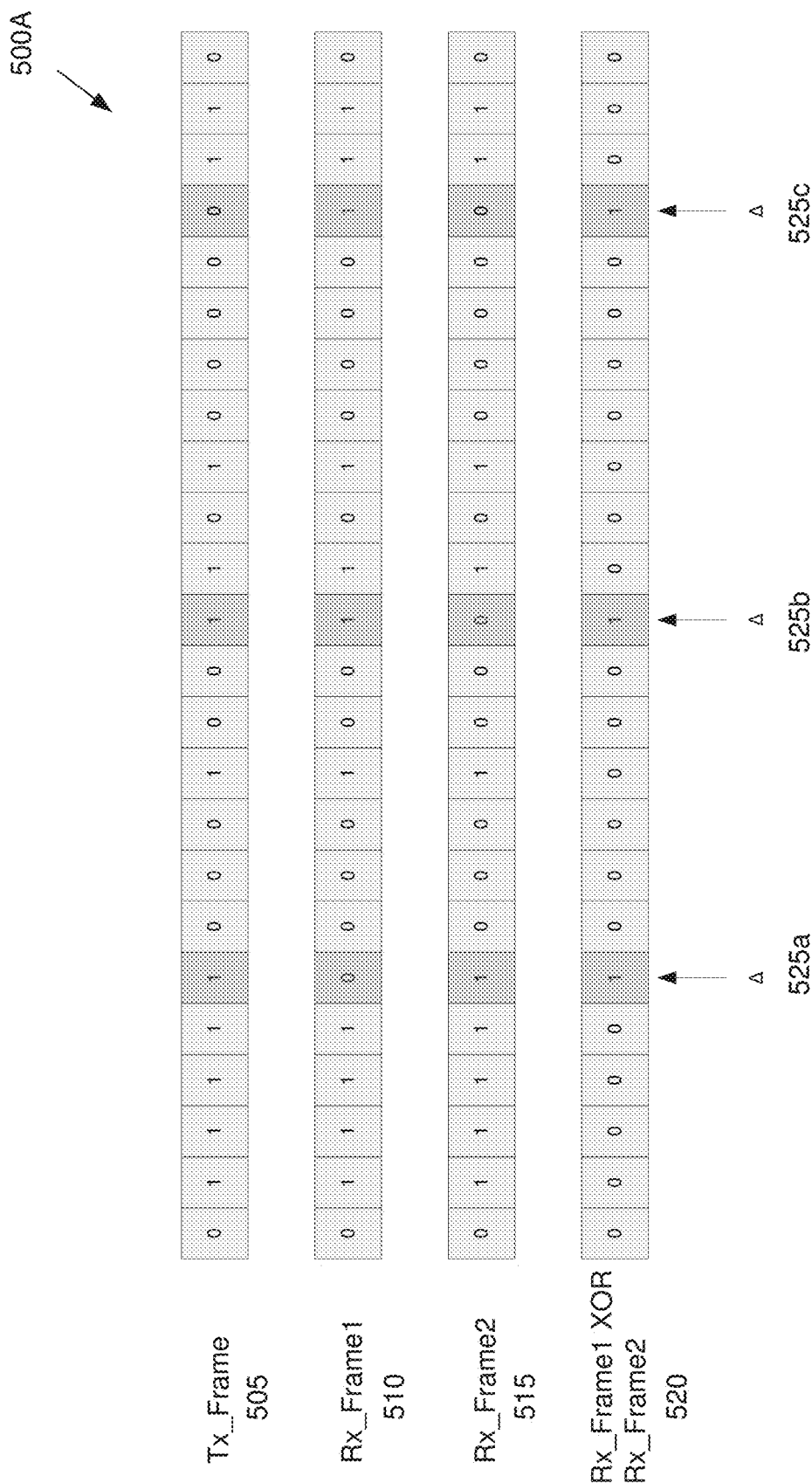
FIG. 5A shows an example of a table used to identify bit errors in a system that receives two redundant data inputs, according to some implementations.

The bit position comparison circuit 310 may operate to perform a bit-wise comparison of the data frames. In some implementations, the bit position comparison circuit 310 performs a bit-wise Exclusive Or operation on the data frames that determines whether each bit in a data frame differs from a corresponding bit in another data frame. FIG. 5A shows the results of a bit-wise Exclusive Or operation on two data frames (see comparison field 520). Moreover, in some implementations, the bit position comparison circuit 310 performs a byte-wise Exclusive Or operation on the data frames that determines whether each byte in a data frame differs from a corresponding byte in another data frame. FIG. 7A shows the results of a byte-wise Exclusive Or operation on two data frames (see comparison field 720). In various implementations, the position comparison circuit 310 performs a summation and voting operation that adds corresponding bits of the data frames, and assigns a voting score to the sums. FIG. 6 shows the results of a comparison and voting operation on two to eight data streams. The voting score may represent a confidence that the bits at that bit position are uncertain.

Figure 5B:
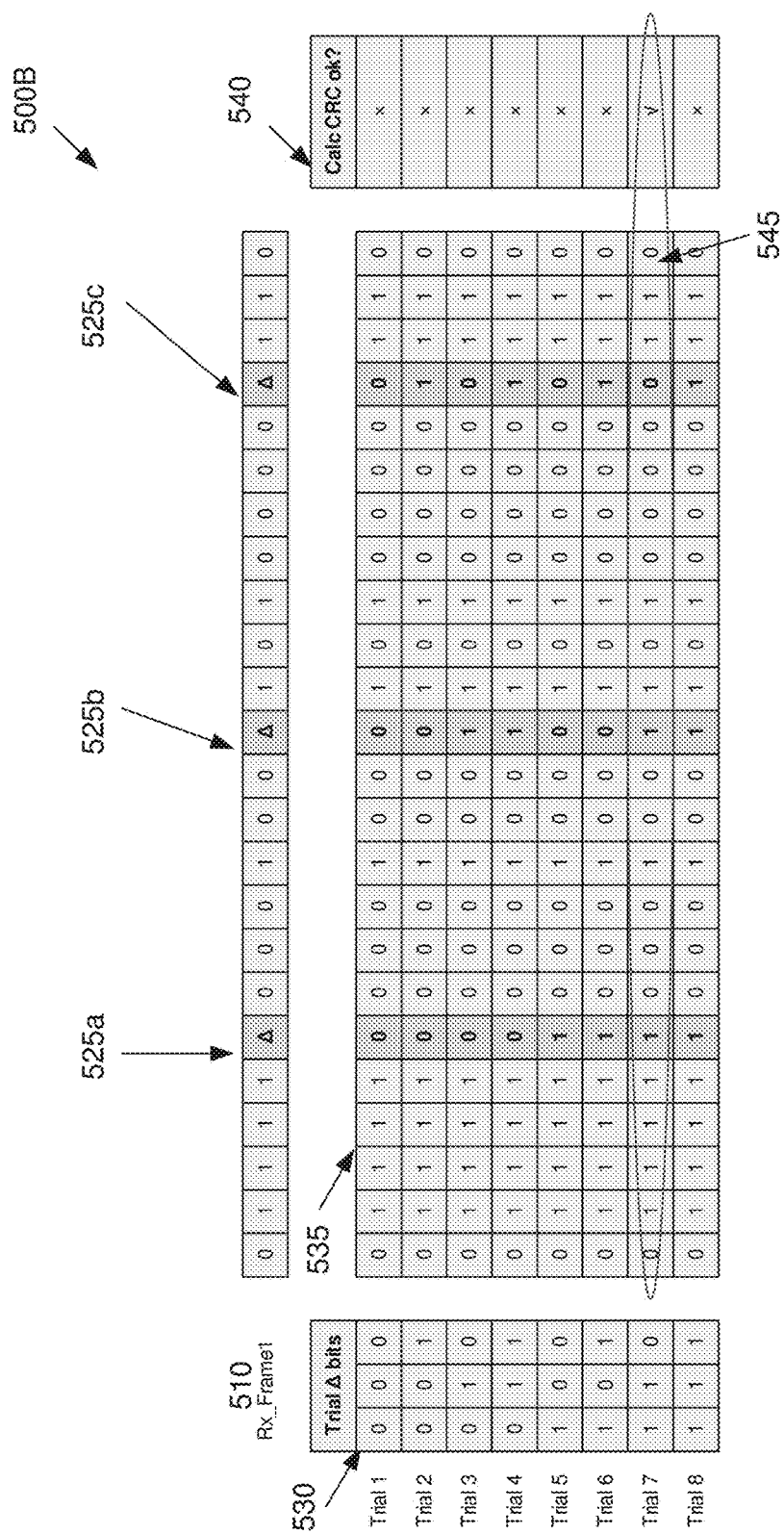
FIG. 5B shows an example of tables used to identify permutations of bit errors in a first received frame, according to some implementations.
Figure 7A:
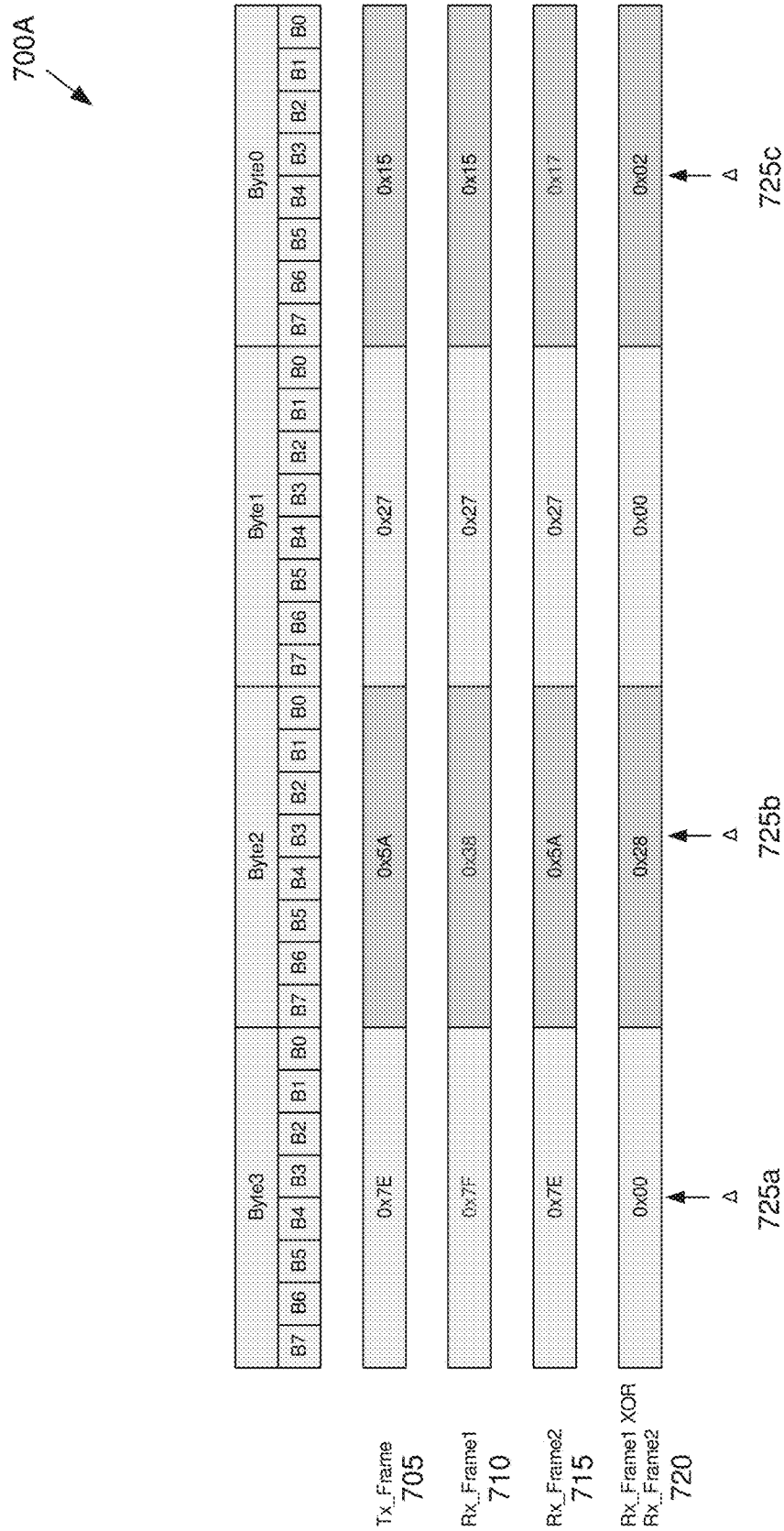
FIG. 7A shows an example of a table used to identify byte errors in two data frames of redundant data, according to some implementations.
Figure 7B:
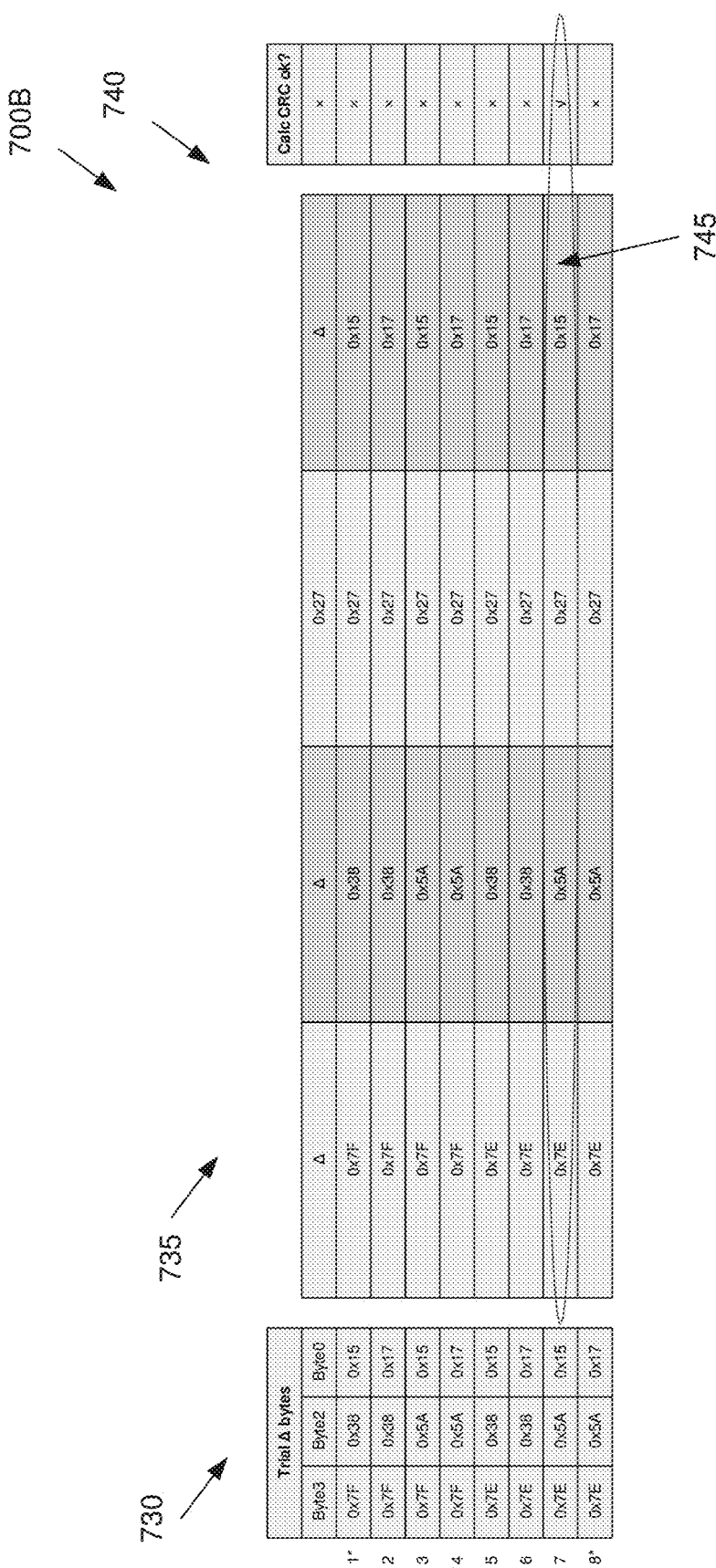
FIG. 7B shows an example of a table used to identify permutations of byte errors in two data frames of redundant data, according to some implementations.

The bit value permutation datastore 315 may operate to identify permutations of bit values at inconsistent bit positions in the data frames. In various implementations, the bit value permutation datastore 315 may provide a permutation table that represents the permutations of the bit values at inconsistent bit positions in the data frames. FIG. 5B shows an example of a permutation table for a bit-wise comparison (see permutation table 530). FIG. 7B shows an example of a permutation table for a byte-wise comparison (see permutation table 730).

The frame permutation assembly circuit 320 may operate to assemble permutations of data frames by replacing inconsistent bit positions with permutations of bit values identified by the bit value permutation datastore 315. FIG. 5B and FIG. 7B show examples of permutations of data frames in bit-comparison and byte-comparison implementations (see permutation frame table 535 and permutation frame table 735), respectively.

In some implementations, the frame permutation assembly circuit 320 performs a "brute force" approach that assembles all permutations of data frames in a permutation table provided by the bit value permutation datastore 315. The frame permutation assembly circuit 320 may alternatively perform a limited approach that reduces the number of permutations of data frames to be assembled from a permutation table. The frame permutation assembly circuit 320 may provide the permutations of data frames to the frame selection circuit 325.

In various implementations, the frame selection circuit 325 may operate to select permutations of data frames to provide permutations of data frames to the frame error detection circuit 330, and select specific permutations of data frames that pass the error checking code implemented by the frame error detection circuit 330. FIG. 5B shows an example of a permutation of a data frame (i.e., trial 7, with permutation 1-1-0) that passed a CRC check in a bit-wise comparison implementation (see CRC validated frame permutation 545). FIG. 7B shows an example of a permutation of a data frame (i.e., trial 7) that passed a CRC check in a bit-wise comparison implementation (see CRC validated frame permutation 745).

FIG. 4 shows an example of a plurality of data frames 400 having payloads, each of whose integrity has been compromised, according to some implementations. The plurality of data frames 400 may include an original transmitted frame 405, a first received frame 420, and a second received frame 425. As shown in FIG. 4, the payloads of both the first received frame 420 and the second received frame 425 have been corrupted due to, e.g., atmospheric or other conditions. More specifically, the first received frame 410 includes a first error 420 at a first position in its payload, and the second received frame 415 includes a second error 425 in its payload. In this example, the first error 420 is located at a first position in the payload of the first received frame 410, and the second error 425 is located at a second position in the payload of the second received frame 415. As shown in FIG. 4, the first position and the second position are at different locations in their respective payloads. It will be appreciated that some implementations will not try to correct an inconsistency if the inconsistency is identified in the error correction value of the header. In other implementations, the system will allow such correction.

FIG. 5A shows an example of a table 500A used to identify bit errors in a system that receives two redundant data inputs, according to some implementations. The table 500A includes an original transmitted frame 505, a first received frame 510, a second received frame 515, and a comparison field 520. The original transmitted frame 505 may include a sequence of bits in a data frame provided by a transmitter. The first received frame 510 may include a sequence of bits in a data frame received by a first receiver, and the second received frame 515 may include a sequence of bits in a data frame received by a second receiver. The comparison field 520 may include the results of a comparison (e.g., an Exclusive Or operation) between the first received frame 510 and the second received frame 515.

In this example, the original transmitted frame 505 is shown without errors. The first received frame 510 and the second received frame 515 contain errors at a first error bit position 525a, a second error bit position 525b, and a third error bit position 525c. It is noted that in this example, the errors in the first received frame 510 and the second received frame 515 occur at different locations. For example, the first received frame 510 contains errors at the first bit position 525a and the third bit position 525c, while the second received frame 515 contains errors at the second bit position 525b. The occurrence of errors in the first received frame 510 and the second received frame 515 at different locations may be due to a variety of reasons, such as atmospheric or other conditions that cause affect the first received frame 510 but not the second received frame 515, or vice versa.

FIG. 5B shows an example of tables 500B used to identify permutations of bit errors in the first received frame 510, according to some implementations. The tables 500B include the first received frame 510, a permutation table 530, a permutation frame table 535, and a CRC table 540. The first received frame 510 may include a sequence of bits in a data frame received by a first receiver. The permutation table 530 may include a table of the permutations of bits in the first received frame 510 that have errors. More specifically, once the bits in the first received frame 510 that have errors (e.g., using an Exclusive Or operation against bits in the second received frame 515), the permutation table 530 may be created and/or gathered. In various implementations, once the delta bits at the at the first bit position 525a, the second bit position 525b, and the third bit position 525c have been identified, a "brute force approach" may be used to test every possible permutation of values for the delta bits to see if it results in a valid CRC calculation.

The permutation frame table 535 may include a table of the permutations of the first received frame 510 when bits in the first received frame 510 that have errors are substituted for values in the permutation table 530. The CRC table 540 may include a table of the results of a CRC computation for the permutations of the first received frame 510 shown in the permutation table 530. In this example, the CRC table 540 returns invalid CRCs for each of the permutations of frames in the permutation frame table 535, except for a CRC validated frame permutation 545. In this example, the CRC table 540 returns a CRC validated frame permutation 545 for the permutation of frames corresponding to an entry in the permutation table 530 of "110." In some implementations, once a valid CRC is found, the corrected frame has been successfully received. More specifically, in some implementations, the process of testing each possible permutation begins with comparing the CRC value of each permutation of frames in the permutation frame table 535. It is noted that once a valid CRC is found the original frame has been recovered with a high degree of certainty.

In this example, the maximum number of trials required to test every permutation is the Nth power of 2 ($2^N$), where N is the maximum number of bit errors to be corrected for a given frame length. The example in FIG. 5B shows that only 8 trials are required for N=3. It is noted, that it is reasonable to implement eight (8) CRC trials in parallel using hardware. For a point-to-point microwave radio transporting Ethernet frames the value N=3 correspond to a realistic operating error rate. Point to point microwave links may be engineered to operate at a bit error rate of $1\times10-9$ or better.

FIG. 5C shows an example of a table 500C that illustrates the expected number of errors for a plurality of radio link Bit Error Rates (BERs) and frame lengths, according to some implementations. The table 500C may include a highlighted area 550 that correspond to expected error rates that exceed one bit per frame. It is noted that the systems and methods herein may be based on the premise that errors occur at different locations in the two received frames. This means that if the systems and methods herein presume E errors per frame from each receiver then the systems and methods herein should be able to correct>2E errors for two receive streams. For example, if we expect two errors per frame then we expect two errors in each received frame giving a total of four errors to correct. Further, at a rate of one bit error per frame, the systems and methods herein may correct two or fewer errors, which is within the capability of a system able to correct N=3 errors. It is noted that for Ethernet jumbo frames up to 10,000 bytes, N=3 is sufficient to support radio links operating at a BER of 1×.

Figure 6A:
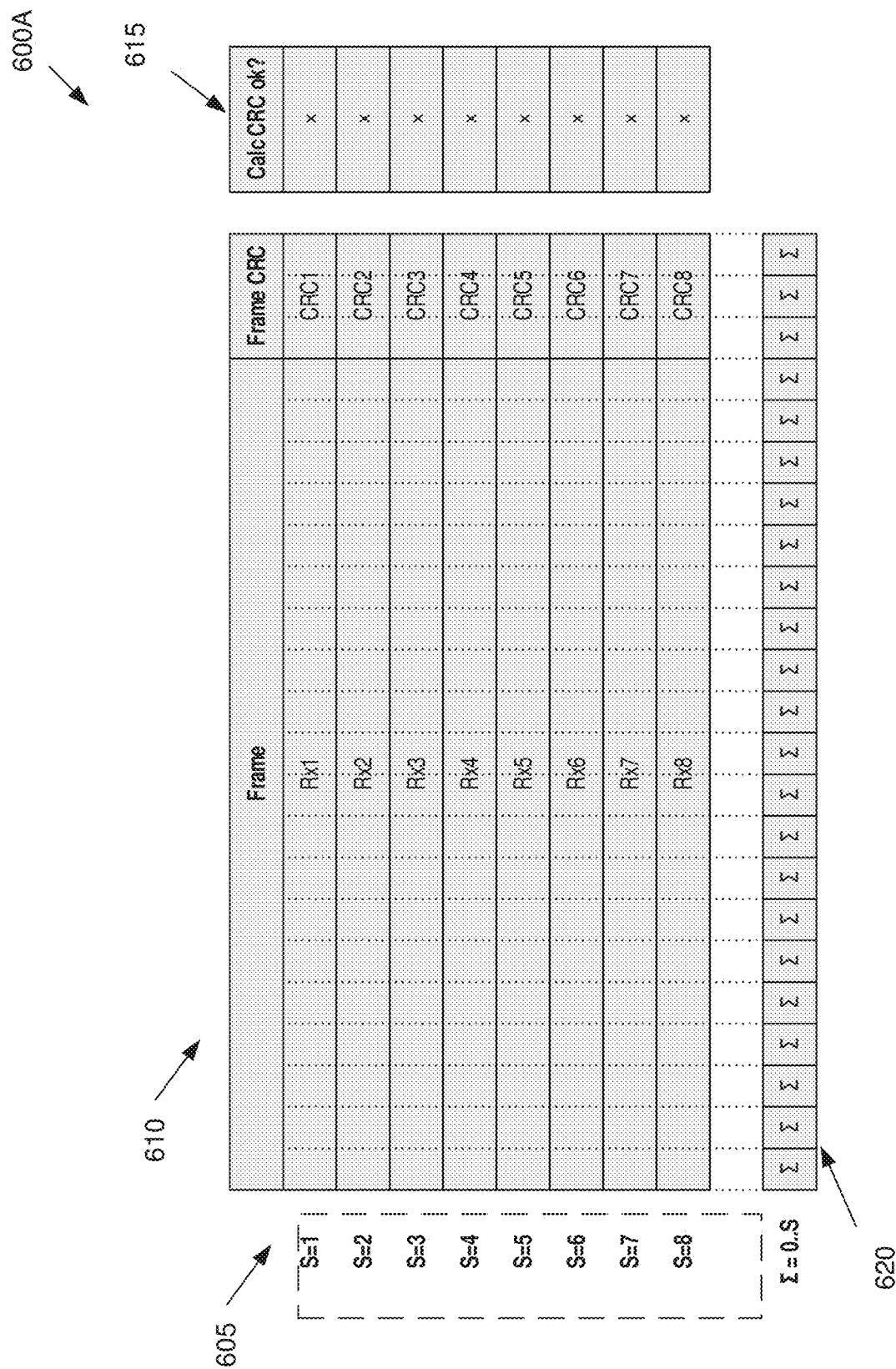
FIG. 6A shows an example of a table used to identify bit errors in a system that receives eight redundant data inputs, according to some implementations.

FIG. 6A shows an example of a table 600A used to identify bit errors in a system that includes eight redundant data inputs 605, according to some implementations. The table 600A may include a permutation table 610, a CRC table 615, and a comparison field 620. The table 600A shows how it is possible to extend the bit error correction scheme to operate with more than two copies of the received frame. In order to utilize multiple receive frames without consuming an excessive computational resources a majority rules approach may be used to determine the delta bits. For each bit position in the frames of the permutation table 610, a sum is generated in the comparison field 620. Once the sum has been generated in the comparison field 620, a threshold may be used to determine if a bit value is uncertain. As an example, a vote in the range 25% to 75% of the vote could be considered uncertain. Bit values selected on the basis of a vote total in this range may be treated as delta bits and used to generate combinations.

Figure 6B:
FIG. 6B shows an example of a plurality of tables used to identify bit errors in a system that includes up to eight redundant data inputs, according to some implementations.
Figure 6B:
Figure 6B:

FIG. 6B shows an example of a plurality of tables 600B used to identify bit errors in a system that includes up to eight redundant data inputs 605, according to some implementations. The plurality of tables 600B may include a comparison table 625 and a vote range table 630. The plurality of tables 600B may provide the comparisons and the vote ranges for up to eight data streams.

FIG. 7A shows an example of a table 700A used to identify byte errors in two data frames of redundant data, according to some implementations. The table 700A includes an original transmitted frame 705, a first received frame 710, a second received frame 715, and a comparison field 720. The original transmitted frame 705 may include a sequence of bytes in a data frame provided by a transmitter. The first received frame 710 may include a sequence of bytes in a data frame received by a first receiver, and the second received frame 715 may include a sequence of bytes in a data frame received by a second receiver. The comparison field 720 may include the results of a comparison (e.g., an Exclusive Or operation) between the first received frame 710 and the second received frame 715.

In this example, the original transmitted frame 705 is shown without errors. The first received frame 710 and the second received frame 715 contain errors at a first error byte position 725a, a second error byte position 725b, and a third error byte position 725c. It is noted that in this example, the errors in the first received frame 710 and the second received frame 715 occur at different locations. For example, the first received frame 715 contains errors at the first error byte position 725a and the second error byte position 725b, while the second received frame 715 contains errors at the third error byte position 725c. The occurrence of errors in the first received frame 710 and the second received frame 715 at different locations may be due to a variety of reasons, such as atmospheric or other conditions that cause affect the first received frame 710 but not the second received frame 715, or vice versa. It is noted that herein, when correcting for a maximum of N=3 byte errors with two receive streams there are 8 combinations. Two of those combinations are the original frames that have failed the initial CRC check.

FIG. 7B shows an example of tables 700B used to identify permutations of byte errors in two data frames of redundant data, according to some implementations. The tables 700B include a permutation table 730, a permutation frame table 735, and a CRC table 740. The permutation table 730 may include a table of the permutations of bytes in the first received frame 710 that have errors. More specifically, once the bytes in the first received frame 710 that have errors (e.g., using an Exclusive Or operation against bytes in the second received frame 715), the permutation table 730 may be created and/or gathered. In various implementations, once the delta bytes at the at the first byte position 725a, the second byte position 725b, and the third byte position 725c have been identified, a "brute force approach" may be used to test every possible permutation of values for the delta bytes to see if it results in a valid CRC calculation.

The permutation frame table 735 may include a table of the permutations of the first received frame 710 when bytes in the first received frame 710 that have errors are substituted for bytes in the permutation table 730. The CRC table 740 may include a table of the results of a CRC computation for the permutations of the first received frame 710 shown in the permutation table 730. In this example, the CRC table 740 returns invalid CRCs for each of the permutations of frames in the permutation frame table 735, except for a CRC validated frame permutation 745. In this example, the permutation of frames corresponding to an entry in the permutation table 530 of "0x7E, 0x5A, 0x15" returns as having a valid CRC. In some implementations, once a valid CRC is found, the corrected frame is deemed to have been successfully received. More specifically, in some implementations, the process of testing each possible permutation begins with comparing the CRC value of each permutation of frames in the permutation frame table 735. It is noted that once a valid CRC is found the original frame has been recovered with a high degree of certainty.

For randomly distributed bit errors in the received frames, the byte correction technique has the potential to fix a greater number of bit errors that bit error correction implementation of similar complexity. For short error bursts the byte correction scheme has the capability to correct relatively high error rates since it replaces 8 bits at a time. For byte correction with N=3 up to 24 bits in a frame could be corrected, this corresponds to a very high BER. However, this is only an appropriate way to characterize the performance of the system if error bursts are expected. For point to point microwave systems an inter-leaver is normally used specifically to minimize the occurrence of adjacent errors. The byte error correction technique is appropriate for applications that experience error bursts that appear at least 8 bits (if the byte length is defined as 8 bits) apart across received data streams. If error bursts are closer than 8 bits apart in the received frames then both received copies of a byte may be corrupted and correction is not possible using the byte swapping technique. Other byte lengths are possible.

FIG. 7C shows an example of a table 700C that illustrates the expected number of errors for a plurality of radio link Bit Error Rates and frame lengths, according to some implementations. The table 700C may include a highlighted area 750 that corresponds to expected error rates that exceed three bit per frame. At a rate of three bit error per frame, the systems and methods herein may correct six or fewer errors, which is within the capability of a system able to correct N=3 errors. For Ethernet jumbo frames up to 10,000 bytes N=3 is sufficient to support radio links operating at a BER of 1×10−5.

FIG. 8 shows an example of a table 800 that illustrates a more efficient strategy for the identification of errors in redundant frames, according to some implementations. More particularly, the table 800 shows a comparison of the number of trials required for a simple brute force approach and the more elaborate approach of testing mutations of each received frame assuming a maximum of R errors in each received frame. For the purposes of this comparison, we have assumed that A=N=SR, which is the worst case that the operations can correct. The assumption is that each received stream may have no more than R errors, amounting to N errors in S received streams. It is noted that it is possible to efficiently generate the required combinations by using a modified grey code without greatly increasing the complexity of the operation. This approach is especially suitable for iterative implementation. For a completely parallel implementation the brute force approach might require fewer resources; especially for low values of N. Note that the Total Combinations in the table below includes the received frame.

Example Flowcharts.

FIGS. 9-14 show examples of flowcharts of methods for correcting errors in data frames of redundant data, according to some implementations.

Figure 9:
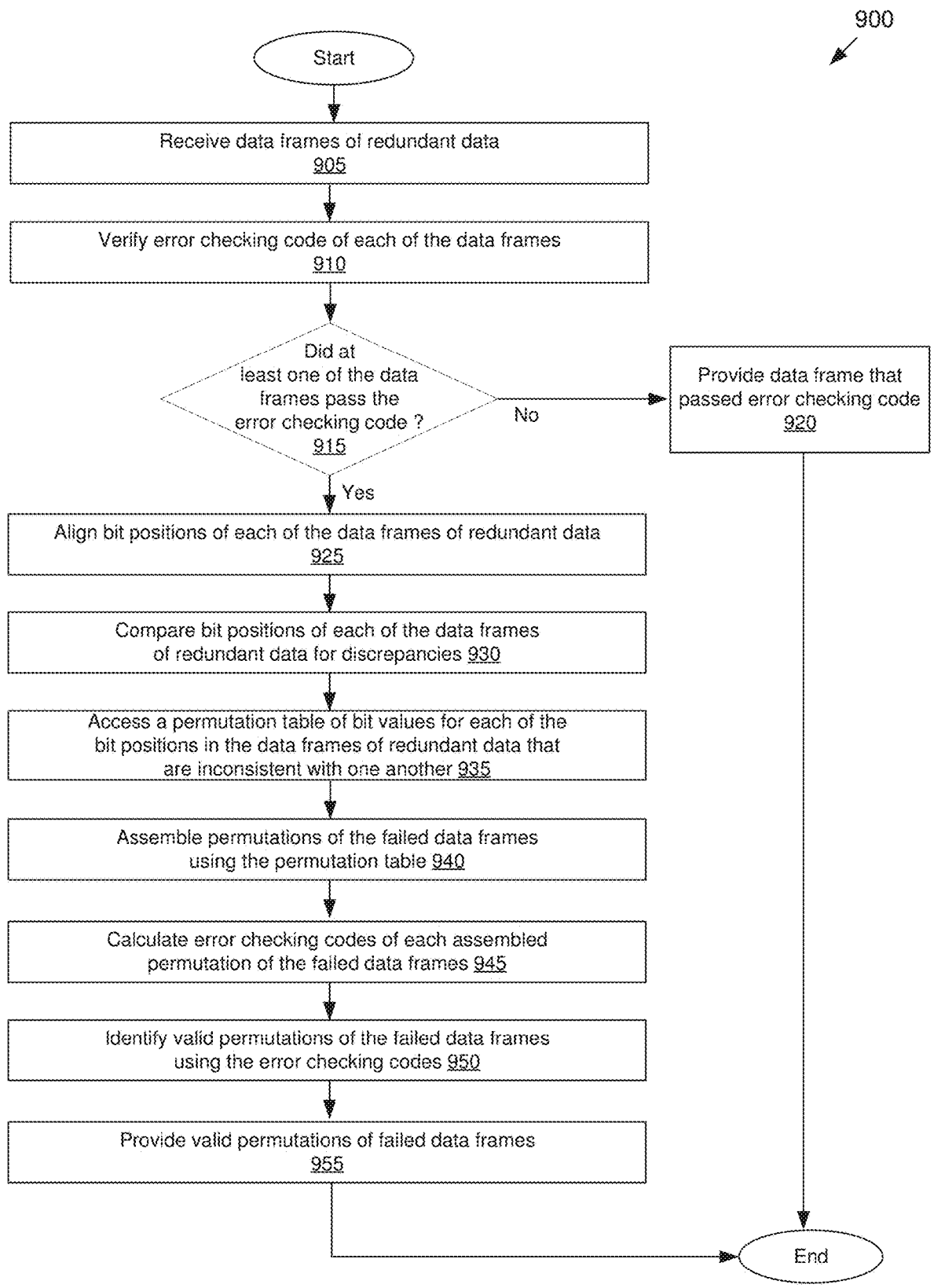
FIG. 9 shows an example flowchart of a method for selecting data frames in a wireless communications receiver, according to some implementations.

FIG. 9 shows an example flowchart of a method 900 of correcting errors in data frames of redundant data, according to some implementations. The method 900 may be executed by the frame error correction circuit 230, shown in FIGS. 2 and 3, and described further herein. At an operation 905, the data interface circuit 340 may receive data frames of redundant data. At an operation 910, the frame error detection circuit 330 may verify error checking code of one or each of the data frames. More particularly, the frame error detection circuit 330 may compute CRCs or other error checking codes for each of the data frames using the values in the payloads of the data frames. The frame error detection circuit 330 may further extract a frame CRC from error checking portion(s) of the data frames, and may compare the calculated CRC with the frame CRC. The method 900 may proceed to a decision point 915.

At the decision point 915, the frame error detection circuit 330 may determine whether one of the data frames passed the error checking code. For instance, in some implementations, the frame error detection circuit 330 determines if the calculated CRC in a payload of a data frame is equal to the frame CRC of the data frame. If at least one of the data frames passed the error checking code, the method 900 may continue to the operation 920. If none of the data frames passed the error checking code, the method 900 may continue to an operation 925.

At an operation 920, the frame error detection circuit 330 may provide the data frame that passed the error checking code to other modules of the signal processing module 215 or the data interface module 220. As the data frame passed the error checking code, the data frame may be presumed valid and/or not corrupted. The frame error detection circuit 330 may provide data from the data frame to the data interface module 220.

At the operation 925, after it has been determined that no data frames have a valid CRC, the data frame alignment circuit 305 may align bit positions of each of the data frames of redundant data. In various implementations, the data frame alignment circuit 305 aligns each position of the data frames of redundant data so that they can be compared with one another. An example of an alignment is shown in FIG. 5A. Another example of an alignment is shown in FIG. 7A.

At an operation 930, the bit position comparison circuit 310 may identify bit positions of each of the data frames of redundant data that contain discrepancies. In some implementations, the bit position comparison circuit 310 performs a bit-wise Exclusive Or operation on the bit positions of the data frames of redundant data. An example of a bit-wise Exclusive Or operation is shown in FIG. 5A. In various implementations, the bit position comparison circuit 310 performs a byte-wise Exclusive Or operation on the bit positions of the data frames of redundant data. An example of a byte-wise Exclusive Or operation is shown in FIG. 7A. In some implementations, the bit position comparison circuit 310 performs a summation and voting operation on the data frames of redundant data. FIGS. 6A and 6B show examples of a summation and voting algorithm. In various implementations, the bit position comparison circuit 310 may provide other modules with the number of inconsistent bits in the data frames of redundant data.

At an operation 935, the bit value permutation datastore 315 may identify bit values for each of the bit positions in the data frames of redundant data that are inconsistent with one another. More particularly, the bit value permutation datastore 315 may gather, create, generate these values, e.g., the values in a truth table; the truth table may have a dimension that corresponds to the number of inconsistent bits in the data frames of redundant data. FIG. 5B shows an example of a permutation table for three inconsistent bits. FIG. 7B shows an example of a permutation table for three inconsistent bytes.

At an operation 940, the frame permutation assembly circuit 320 may assemble permutations of the data frames using the permutation table. In various implementations, the frame permutation assembly circuit 320 reconstructs a set of data frames, each having the inconsistent bits replaced with the permutations identified in the permutation table. FIGS. 5B and 7B show examples of assembled permutations of data frames. In some implementations, the frame permutation assembly circuit 320 uses a brute force approach to generate all permutations of a failed data frame. In various implementations, however, the frame permutation assembly circuit 320 uses a limited approach to generate less than all of the permutations of a data frame.

At an operation 945, the frame error detection circuit 330 may calculate error checking codes of each assembled permutation of the data frames. More particularly, the frame error detection circuit 330 may determine whether the CRC calculated using the payloads of any of the assembled permutations of the data frames matches the CRC in the error checking portion(s) of those frames. At an operation 950, the frame selection circuit 325 may identify valid permutations of the data frames using the error checking codes. At an operation 955, the data interface circuit 340 may provide valid permutations of data frames to the data interface module 220. It is noted that because these permutations have passed the error checking codes, there is confidence that these permutations correspond to the data frames originally sent at a transmitter.

Figure 10:
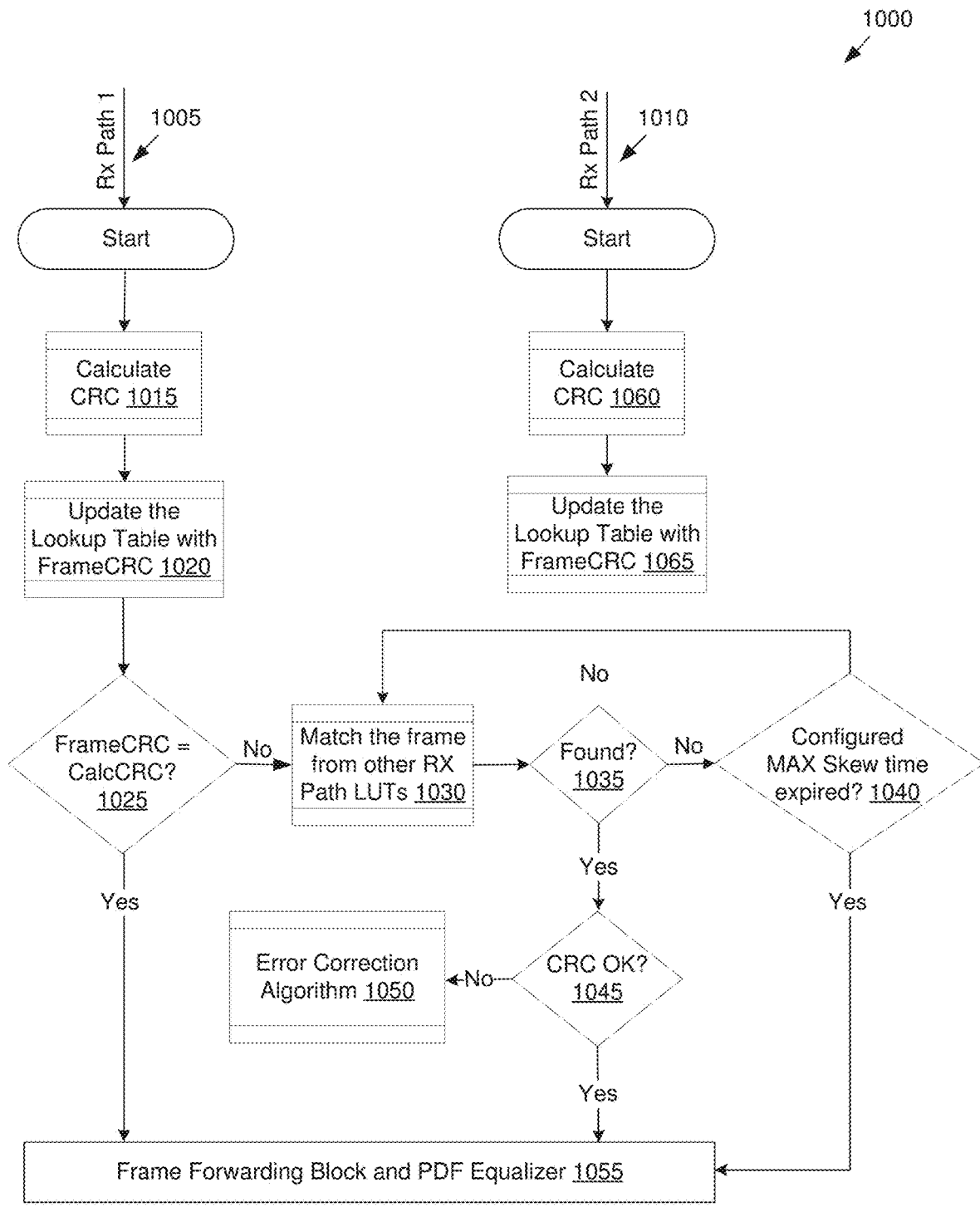
FIG. 10 shows an example flowchart of a method for selecting data frames in a wireless communications receiver, according to some implementations.

FIG. 10 shows an example flowchart of a method 1000 for selecting data frames in a wireless communications receiver, according to some implementations. The method 1000 may be implemented by the frame selection circuit 325, described further herein. At an operation 1005, a first data frame of redundant data is received over a first data path. At an operation 1010, a second data frame of redundant data is received over a second data path. At an operation 1015, a CRC of the first data frame is calculated. At an operation 1020, a lookup table may be updated with the calculated CRC of the first data frame. At a decision point 1025, it may be identified whether the frame CRC is equal to the calculated CRC. If so, the method may proceed to an operation 1055, at which data frame may be forwarded.

If the frame CRC is not equal to the calculated CRC, the method 1000 may proceed to the operation 1030, at which the frame is matched with other receive path LUTs. At an operation 1035, it is determined whether the frame was matched with the other receive path LUTs. If the frame was not matched with the other receive path LUTs, the method 1000 may proceed to the decision point 1040, at which it is determined whether the configured maximum skew time has expired. If the configured maximum skew time has not expired, the method 1000 may return to the operation 1030. If the configured maximum skew time has expired, the method 1000 may proceed to the operation 1055, at which data frame may be forwarded.

If the frame was matched with the other receive path LUTs, the method 1000 may proceed to the decision point 1045, at which it is determined whether the CRC is correct. If the CRC is correct, the method 1000 may proceed to the operation 1055, at which data frame may be forwarded. If the CRC is not correct, the method 1000 may proceed to the operation 1050, at which an error correction algorithm is implemented.

Figure 11:
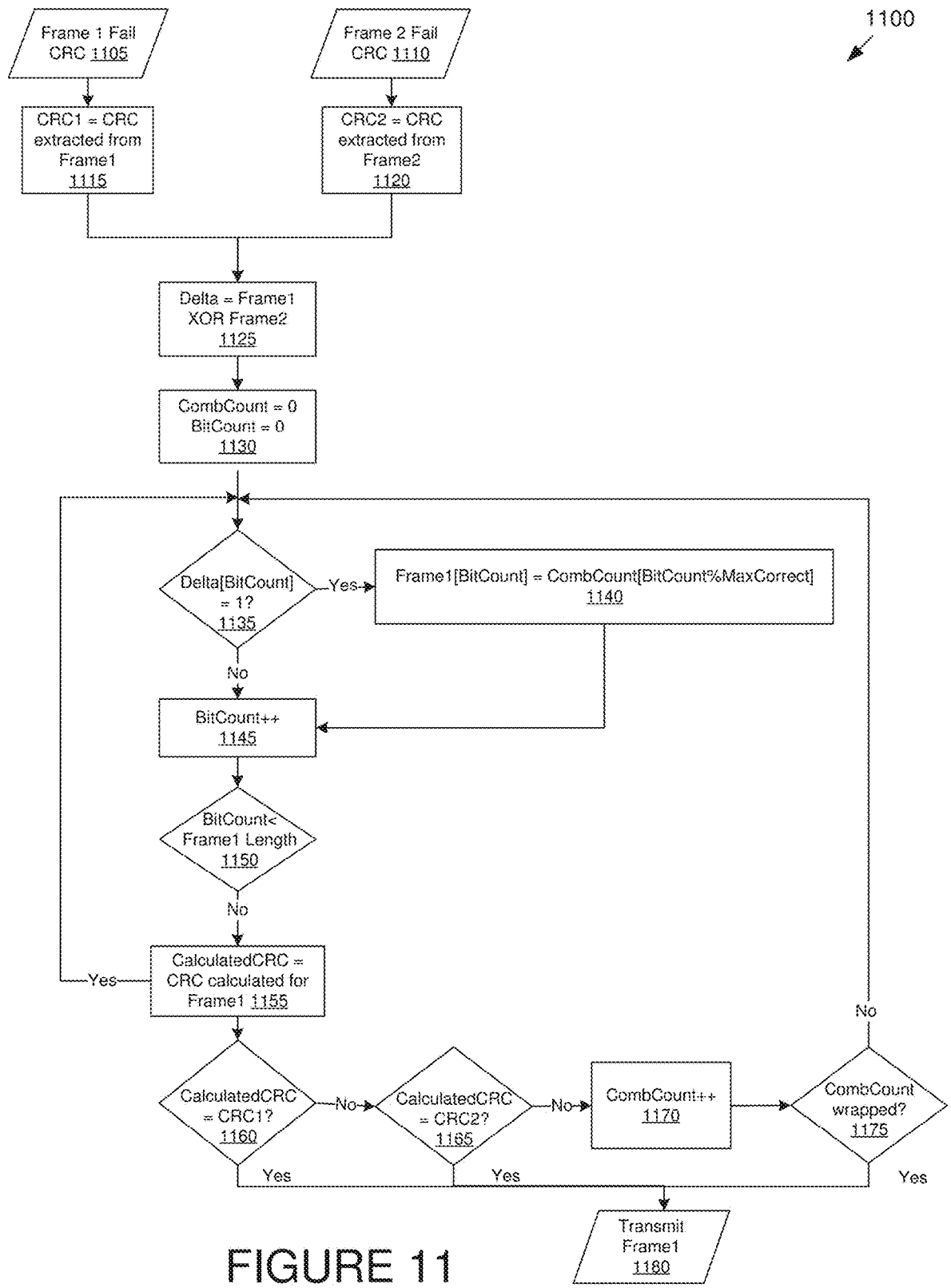
FIG. 11 shows an example logic circuit for correcting bit errors in a wireless communications receiver, according to some implementations.

FIG. 11 shows an example logic circuit 1100 for correcting bit errors in a wireless communications receiver, according to some implementations. The logic circuit 1100 may be performed by the frame error correction circuit 230, discussed further herein. At an operation 1105, a CRC has failed for a first data frame of redundant data. At an operation 1110, a CRC has failed for a second data frame of redundant data.

At the operation 1115, a CRC may be extracted from the error checking portions of the first data frame and used as the basis of a variable "CRC1." At the operation 1120, a CRC may be extracted from the error checking portions of the second data frame and used as the basis of a variable "CRC2." The variables CRC1 and CRC2 may be used to verify whether permutations of data frames are valid as discussed further herein. In various implementations, the logic circuit 1100 may proceed to an operation 1125.

At an operation 1125, the first data frame and the second data frame are compared. In some implementations, an Exclusive Or operation is used to compare the first data frame and the second data frame. A variable (e.g., "delta") may be set to represent the result of the comparison. At an operation 1130, additional variables used to create permutations of data frames may be instantiated. As an example, a variable "CombCount," which may be used to represent permutations of data frames (e.g., possible combinations of bit values to test in delta bit positions may be set). As another example, a variable "BitCount," which may be used to identify specific bit positions, may be set. The logic circuit 1100 may proceed to a decision point 1135.

At the decision point 1135, it is determined whether there is a bit inconsistency between the first data frame and the second data frame at a specified bit position. (As discussed further herein, the bit position may originally be set to zero, and incremented at the operation 1145.) If so, the logic circuit 1100 may proceed to an operation 1140, at which the bit position of the first data frame is set to a bit position of the CombCount variable. At an operation 1145, the BitCount variable may be incremented.

At a decision point 1150, it is determined whether the BitCount variable is less than the length of the first data frame. If so, the logic circuit 1100 may return to the decision point 1135. If not, the logic circuit 1100 may proceed to an operation 1155, at which the CRC of the first data frame is calculated. At a decision point 1160, it is determined whether the calculated CRC of the first data frame is equal to the extracted CRC for the first data frame. If so, the first data frame may be transmitted at an operation 1180.

If the calculated CRC of the first data frame is not equal to the extracted CRC for the first data frame, the logic circuit 1100 may proceed to the decision point 1165, at which it is determined whether the calculated CRC of the second data frame is equal to the extracted CRC for the second data frame. If so, the first data frame may be transmitted at an operation 1180. If not, the logic circuit 1100 may proceed to the operation 1170, at which the variable CombCount is incremented. At a decision point 1175, it is determined whether the variable CombCount has been wrapped. If not, the logic circuit 1100 may return to the decision point 1135. If so, the first data frame may be transmitted at an operation 1180.

Figure 12:
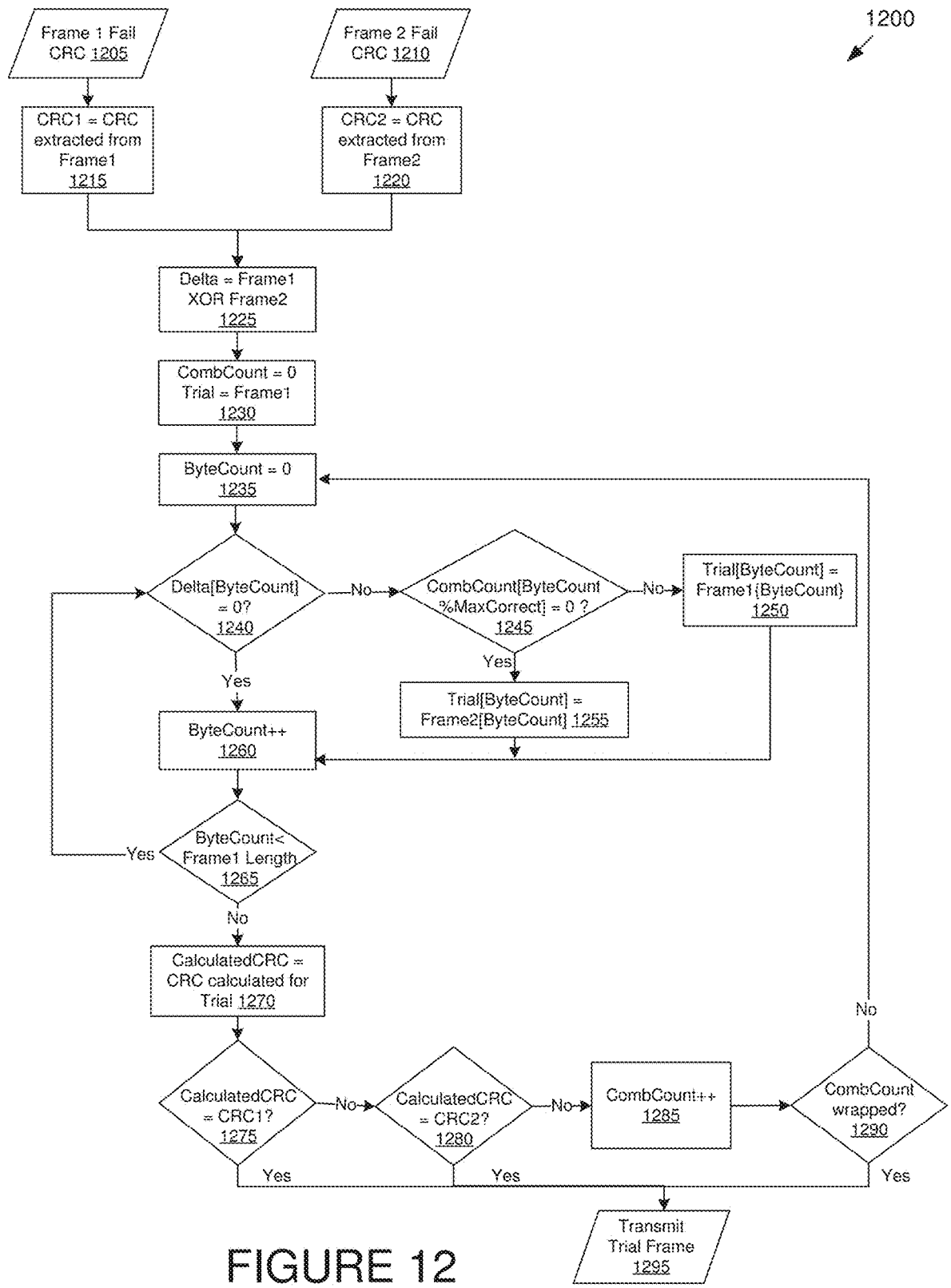
FIG. 12 shows an example logic circuit for correcting byte errors in a wireless communications receiver, according to some implementations.

FIG. 12 shows an example logic circuit 1200 for correcting byte errors in a wireless communications receiver, according to some implementations. The logic circuit 1200 may be performed by the frame error correction circuit 230, discussed further herein. At an operation 1205, a CRC has failed for a first data frame of redundant data. At an operation 1210, a CRC has failed for a second data frame of redundant data.

At the operation 1215, a CRC may be extracted from the error checking portions of the first data frame and used as the basis of a variable "CRC1." At the operation 1220, a CRC may be extracted from the error checking portions of the second data frame and used as the basis of a variable "CRC2." The variables CRC1 and CRC2 may be used to verify whether permutations of data frames are valid as discussed further herein. In various implementations, the logic circuit 1200 may proceed to an operation 1225.

At an operation 1225, the first data frame and the second data frame are compared. In some implementations, an Exclusive Or operation is used to compare the first data frame and the second data frame. A variable (e.g., "delta") may be set to represent the result of the comparison. At an operation 1230, additional variables used to create permutations of data frames may be instantiated. As an example, the variables "CombCount" and "Trial," which may be used to represent permutations of data frames (e.g., possible combinations of bit values to test in delta bit positions may be set). At an operation 1235, a variable "ByteCount," which may be used to identify specific byte positions, may be set.

At a decision point 1240, it is determined whether there is a byte inconsistency between the first data frame and the second data frame at a specified byte position. (As discussed further herein, the byte position may originally be set to zero, and incremented at the operation 1260.) If so, the logic circuit 1200 may proceed to an operation 1260, at which the bit position of the first data frame is set to a bit position of the CombCount variable. If not, the logic circuit 1200 may proceed to swap bytes to generate permutations of data frames. More specifically, at a decision point 1245, it may be determined whether the CombCount variable is zero for a specified ByteCount. If not, the logic circuit 1200 may proceed to an operation 1250, at which the variable Trial is set to the value of the first frame at the specified byte position. If so, however, the logic circuit 1200 may proceed to an operation 1255, at which the Trial variable is set to the value of the second frame at the specified byte position.

At an operation 1260, the byte position may be incremented. At a decision point 1265, it may be determined whether the byte position is less than the length of the first data frame. If so, the logic circuit 1200 may return to the decision point 1240. If not, the logic circuit 1200 may proceed to an operation 1270, at which the CRC of the first data frame is calculated. At a decision point 1275, it is determined whether the calculated CRC of the first data frame is equal to the extracted CRC for the first data frame. If so, the trial frame may be transmitted at an operation 1295.

If the calculated CRC of the first data frame is not equal to the extracted CRC for the first data frame, the logic circuit 1200 may proceed to the decision point 1280, at which it is determined whether the calculated CRC of the second data frame is equal to the extracted CRC for the second data frame. If so, the trial frame may be transmitted at an operation 1295. If not, the logic circuit 1200 may proceed to the operation 1285, at which the variable CombCount is incremented. At a decision point 1290, it is determined whether the variable CombCount has been wrapped. If not, the logic circuit 1200 may return to the operation 1235. If so, the trial frame may be transmitted at an operation 1295.

Figure 13:
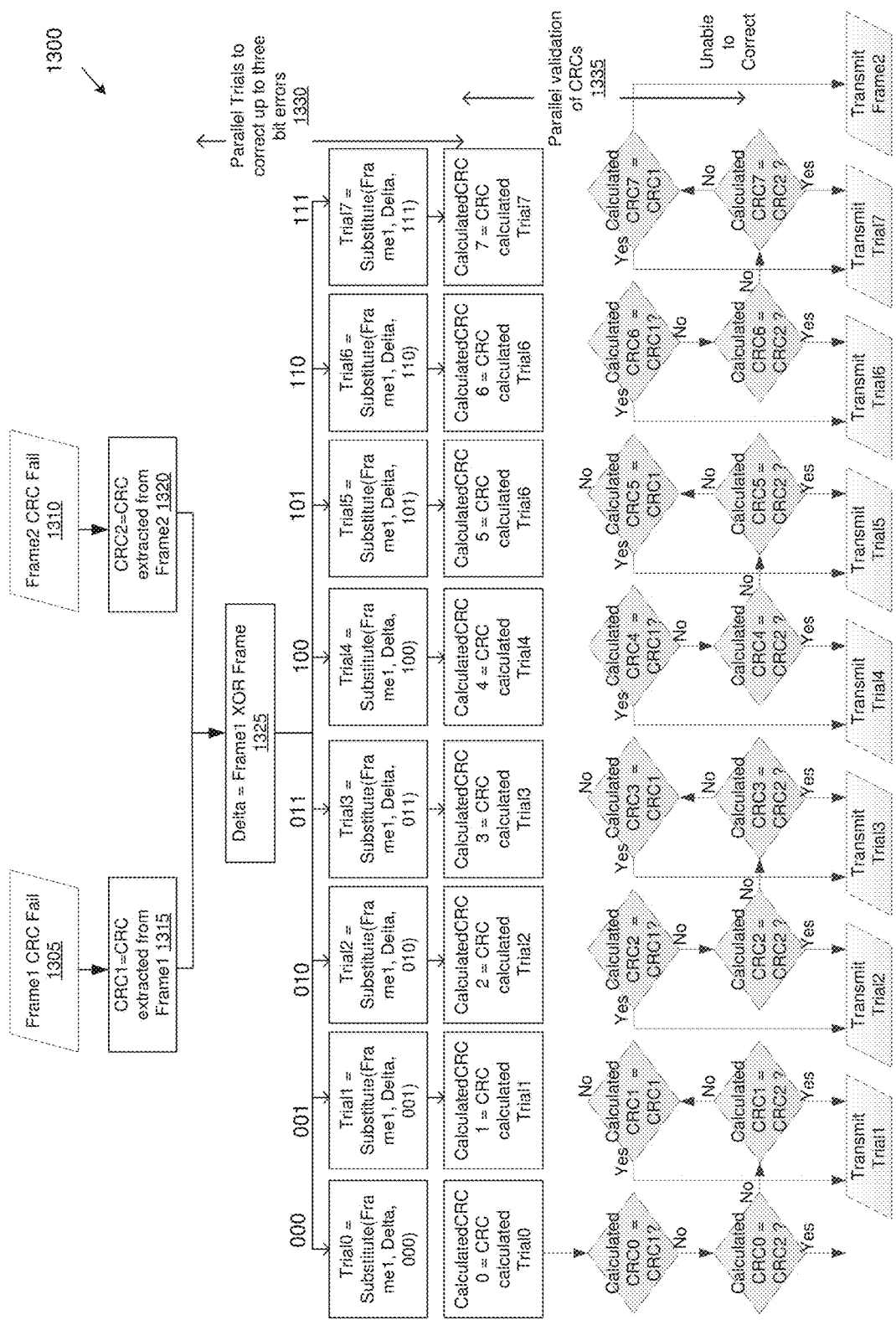
FIG. 13 shows an example logic circuit for correcting errors in data frames of redundant data, according to some implementations.

FIG. 13 shows an example logic circuit 1300 for correcting errors in data frames of redundant data, according to some implementations. The logic circuit 1300 may be an implementation of the frame error correction circuit 230, discussed further herein. At an operation 1305, a CRC has failed for a first data frame of redundant data. At an operation 1310, a CRC has failed for a second data frame of redundant data.

At the operation 1315, a CRC may be extracted from the error checking portions of the first data frame and used as the basis of a variable "CRC1." At the operation 1320, a CRC may be extracted from the error checking portions of the second data frame and used as the basis of a variable "CRC2." The variables CRC1 and CRC2 may be used to verify whether permutations of data frames are valid as discussed further herein. In various implementations, the logic circuit 1300 may proceed to the operations 1335.

At an operation 1325, the first data frame and the second data frame are compared. In some implementations, an Exclusive Or operation is used to compare the first data frame and the second data frame. A variable (e.g., "delta") may be set to represent the result of the comparison.

At the operations 1330, parallel trials may be instituted to correct up to three bit errors. Each parallel trial may test substitution of a permutation of three bits into inconsistent bits of the first and second data frames so that permutations of the first and second data frames can be assembled. At the operations 1335, it is determined whether permutation of the first and second data frames match the CRC extracted from the error checking portion(s) of the data frames. The permutations of the first and second frames that match the CRC extracted from the error checking portion(s) of the data frames may be transmitted to the data interface module 220.

Example Functional Block Diagram of System 1400 to Select Data Frames.

Figure 14:
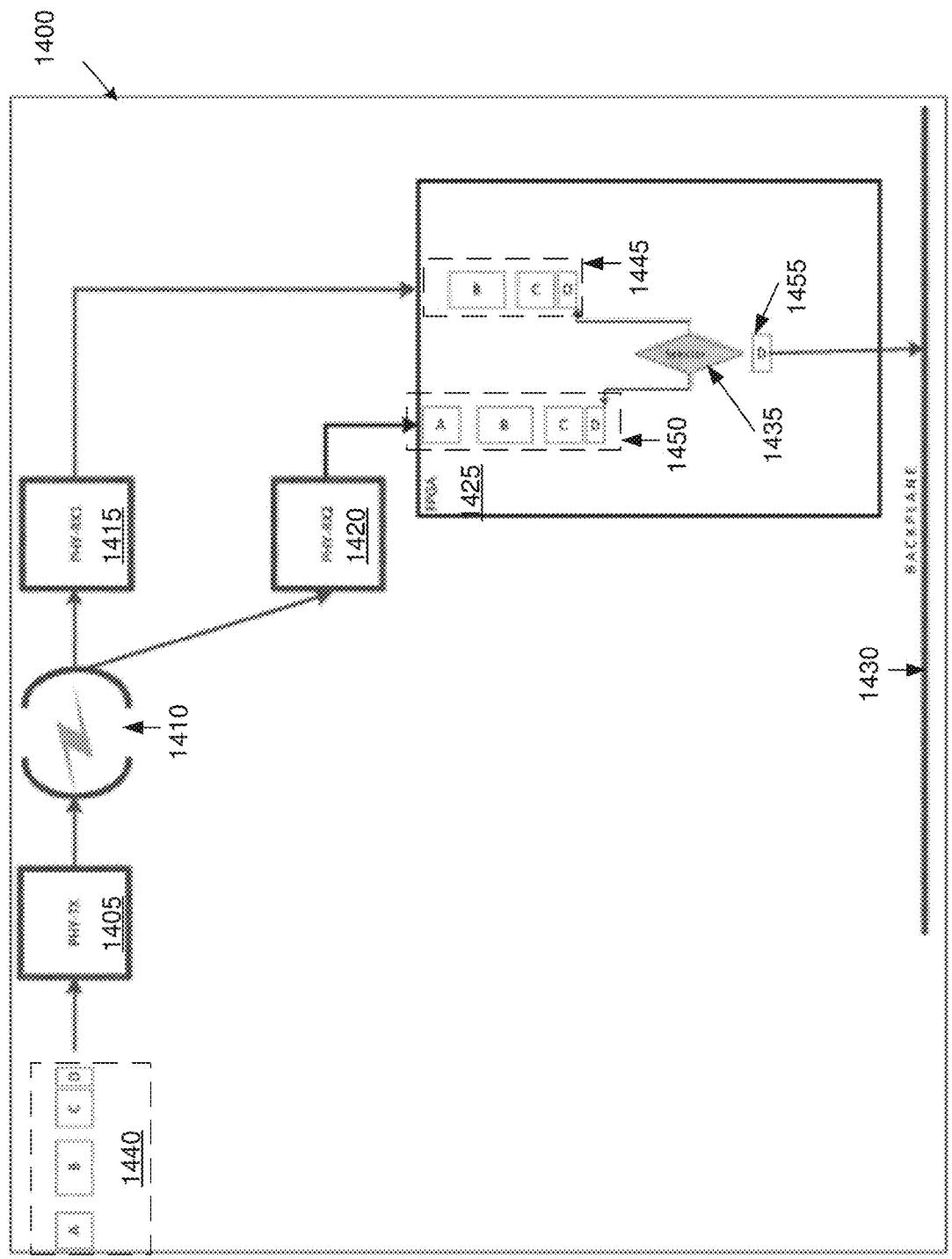
FIG. 14 shows an example of a functional block diagram of a system used to select data frames in a wireless communications receiver, according to some implementations.

FIG. 14 shows an example of a functional logic diagram of a system 1400 used to select data frames in a wireless communications receiver, according to some implementations. The system 1400 includes a transmitter physical layer 1405, a radio link 1410, a first receiver physical layer 1415, a second receiver physical layer 1420, a Field Programmable Gate Array (FPGA) 1425, and a backplane 1430. In various implementations, the transmitter physical layer 1405 receives a transmitter data stream 1440 of data to be sent wirelessly over the radio link 1410. The transmitter data stream 1440 may include frames (e.g., Ethernet frames A, B, C, and D) to be sent wirelessly over the radio link 1410. The first receiver physical layer 1415 may provide the FPGA 1425 with the first receiver data stream 1445, and the second receiver physical layer 1420 may provide the FPGA 1425 with the second receiver data stream 1450. The FPGA 1425 may include a selector 1435 that compares bit or byte positions in the first receiver data stream 1445 with corresponding bit or byte positions in the second receiver data stream 1450, and provides corrected frames to the backplane 1430. In this example, the selector 1435 has selected a corrected version of the frame D and has sent that corrected version to the backplane 1430.

In some embodiments, the circuitry can be implemented using an FPGA, ASIC or other circuit mechanism. In some embodiments, the above-described functions and components may be comprised of instructions that are stored on a storage medium such as a computer readable medium. The instructions may be retrieved and executed by a processor. Some examples of instructions are software, program code, and firmware. Some examples of storage medium are memory devices, tape, disks, integrated circuits, and servers. The instructions are operational when executed by the processor to direct the processor to operate in accord with some implementations. Those skilled in the art are familiar with instructions, processor(s), and storage medium.

For purposes of explanation, numerous specific details are set forth in order to provide a thorough understanding of the description. It will be apparent, however, to one skilled in the art that implementations of the disclosure can be practiced without these specific details. In some instances, modules, structures, processes, features, and devices are shown in block diagram form in order to avoid obscuring the description. In other instances, functional block diagrams and flow diagrams are shown to represent data and logic flows. The components of block diagrams and flow diagrams (e.g., modules, blocks, structures, devices, features, etc.) may be variously combined, separated, removed, reordered, and replaced in a manner other than as expressly described and depicted herein.

Reference in this specification to "one implementation", "an implementation", "some implementations", "various implementations", "certain implementations", "other implementations", "one series of implementations", or the like means that a particular feature, design, structure, or characteristic described in connection with the implementation is included in at least one implementation of the disclosure. The appearances of, for example, the phrase "in one implementation" or "in an implementation" in various places in the specification are not necessarily all referring to the same implementation, nor are separate or alternative implementations mutually exclusive of other implementations. Moreover, whether or not there is express reference to an "implementation" or the like, various features are described, which may be variously combined and included in some implementations, but also variously omitted in other implementations. Similarly, various features are described that may be preferences or requirements for some implementations, but not other implementations.

The language used herein has been principally selected for readability and instructional purposes, and it may not have been selected to delineate or circumscribe the inventive subject matter. It is therefore intended that the scope be limited not by this detailed description, but rather by any claims that issue on an application based hereon. Accordingly, the disclosure of the implementations is intended to be illustrative, but not limiting, of the scope, which is set forth in the following claims.

The invention claimed is:

1. A receiver system comprising:
 a data interface circuit configured to receive a plurality of data frames corresponding to redundant data, the plurality of data frames having an error checking portion, the error checking portion having a frame error checking code, the plurality of data frames including a first data frame and a second data frame;
 a comparison circuit coupled to the data interface circuit, the comparison circuit configured to perform a bit comparison of first bit values at bit positions of the first data frame of the plurality of data frames against second bit values at the bit positions of a second data frame of the plurality of data frames, and to identify based on the bit comparison inconsistent bit values between the first bit values and the second bit values;
 a frame permutation assembly circuit coupled to the comparison circuit, the frame permutation assembly circuit configured to assemble at least one new permutation of data frame, the at least one new permutation of data frame including a unique set of bit values across the bit positions having the inconsistent bit values; and
 a frame error checking circuit coupled to the frame permutation assembly circuit, the frame error checking circuit implemented in hardware and configured to perform an analysis of the at least one new permutation of data frame for validation of a calculated error checking code, the validation including a calculation of the calculated error checking code of the at least one new permutation of data frame, and a comparison of the calculated error checking code with the frame error checking code in the error checking portion of one of the first data frame and the second data frame, the frame error checking circuit configured to allow a validated permutation of data frame to pass through to another hardware circuit of the receiver system.

2. The receiver system of claim 1, wherein:
 the comparison circuit is configured to perform a byte comparison of first byte values at byte positions of the first data frame of the plurality of data frames against second byte values at the byte positions of the second data frame of the plurality of data frames, and to identify, based on the byte comparison, inconsistent byte values between the first byte values and the second byte values; and the at least one new permutation of data frame includes a unique set of permutation of bytes at each of the inconsistent byte values.

3. The receiver system of claim 1, wherein the system is incorporated into an indoor unit (IDU) of a split-mount radio system.

4. The receiver system of claim 1, wherein the comparison circuit is configured to perform a bitwise Exclusive Or (XOR) operation on each of the plurality of data frames to identify the inconsistent bit positions in the plurality of data frames.

5. The receiver system of claim 1, wherein the comparison circuit is configured to perform a summation and voting operation on each of the plurality of data frames to identify the inconsistent bit positions in the plurality of data frames.

6. The receiver system of claim 5, wherein the plurality of data frames comprises more than two data frames.

7. The receiver system of claim 1, wherein the system supports a radio link, and wherein the at least one new permutation of data frame includes a number of new permutations of data frames limited by a specified error rate of the radio link.

8. The receiver system of claim 1, wherein the plurality of data frames comprises Ethernet data frames.

9. The receiver system of claim 1, wherein the hardware comprises a Field Programmable Gate Array (FPGA) incorporated into a radio access card (RAC) of an indoor unit of a split-mount radio system.

10. A method implemented by one or more physical processors of a receiver, the method comprising:
    receiving a plurality of data frames corresponding to redundant data, the plurality of data frames having an error checking portion, the error checking portion having a frame error checking code, the plurality of data frames including a first data frame and a second data frame;
    performing a bit comparison of first bit values at bit positions of the first data frame of the plurality of data frames against second bit values at the bit positions of a second data frame of the plurality of data frames;
    identifying, based on the bit comparison, inconsistent bit values between the first bit values and the second bit values;
    assembling at least one new permutation of data frame, the at least one new permutation of data frame including a unique set of bit values across the bit positions having the inconsistent bit values;
    performing an analysis of the at least one new permutation of data frame for validation of a calculated error checking code, the validation including a calculation of the calculated error checking code of the at least one permutation of data frame, and a comparison of the calculated error checking code with the frame error checking code in the error checking portion of one of the first data frame and the second data frame; and
    allowing a validated permutation of data frame to pass through to another hardware circuit of the receiver system.

11. The method of claim 10, wherein:
    performing the bit comparison comprises performing a byte comparison of first byte values at byte positions of the first data frame of the plurality of data frames against second byte values at the byte positions of the second data frame of the plurality of data frames, and identifying, based on the byte comparison, inconsistent byte values between the first byte values and the second byte values; and
    the at least one new permutation of data frame includes a unique set of permutations of bytes at each of the inconsistent byte values.

12. The method of claim 10, wherein the method is executed by a controller module of an indoor unit (IDU) of a split-mount radio system.

13. The method of claim 10, wherein performing the bit comparison comprises performing a bitwise Exclusive Or (XOR) operation on each of the plurality of data frames to identify the inconsistent bit values.

14. The method of claim 10, wherein performing the bit comparison comprises performing a summation and voting operation on each of the plurality of data frames to identify the inconsistent bit values.

15. The method of claim 14, wherein the plurality of data frames comprises more than two data frames.

16. The method of claim 10, wherein the at least one new permutation of data frame includes a number of new permutations of data frames limited by a specified error rate of a radio link supporting communication of the plurality of data frames.

17. The method of claim 10, wherein the plurality of data frames comprises Ethernet data frames.

18. The method of claim 10, wherein the receiver comprises a Field Programmable Gate Array (FPGA) incorporated into a radio access card (RAC) of an indoor unit of a split-mount radio system.

* * * * *